(12) United States Patent
Yamazaki et al.

(10) Patent No.: US 8,847,480 B2
(45) Date of Patent: Sep. 30, 2014

(54) LIGHTING DEVICE

(75) Inventors: Shunpei Yamazaki, Tokyo (JP); Yasuyuki Arai, Kanagawa (JP); Noriko Shibata, Kanagawa (JP); Yukie Suzuki, Kanagawa (JP); Yasuo Nakamura, Tokyo (JP); Ikuko Kawamata, Kanagawa (JP); Yoshitaka Moriya, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 139 days.

(21) Appl. No.: 12/722,791

(22) Filed: Mar. 12, 2010

(65) Prior Publication Data

US 2010/0237774 A1 Sep. 23, 2010

(30) Foreign Application Priority Data

Mar. 18, 2009 (JP) ................. 2009-066561

(51) Int. Cl.
*H01L 51/50* (2006.01)
*H05B 33/22* (2006.01)
*H05B 33/28* (2006.01)

(52) U.S. Cl.
CPC ............... *H05B 33/28* (2013.01); *H05B 33/22* (2013.01)
USPC ......................................................... 313/506

(58) Field of Classification Search
CPC ....................................................... H05B 33/28
USPC ......................................................... 313/506
See application file for complete search history.

(56) References Cited

U.S. PATENT DOCUMENTS

| 5,965,981 | A  | * | 10/1999 | Inoguchi et al. ............. 313/506 |
| 6,225,552 | B1 |   | 5/2001  | Nishi et al. |
| 6,565,231 | B1 |   | 5/2003  | Cok |
| 6,664,137 | B2 | * | 12/2003 | Weaver ......................... 438/125 |
| 6,686,063 | B2 |   | 2/2004  | Kobayashi |
| 6,787,990 | B2 |   | 9/2004  | Cok |
| 7,075,226 | B2 |   | 7/2006  | Cok |
| 7,816,695 | B2 |   | 10/2010 | Lin et al. |
| 8,283,677 | B2 |   | 10/2012 | Takizawa et al. |
| 8,395,319 | B2 |   | 3/2013  | Tchakarov et al. |
| 2004/0227460 | A1 | * | 11/2004 | Liao et al. ..................... 313/506 |
| 2005/0122037 | A1 |   | 6/2005  | Utsumi et al. |
| 2005/0258436 | A1 |   | 11/2005 | Arai |
| 2008/0180936 | A1 |   | 7/2008  | Ogashiwa |
| 2010/0236691 | A1 |   | 9/2010  | Yamazaki |

(Continued)

FOREIGN PATENT DOCUMENTS

| JP | 4-16897 | 2/1992 |
| JP | 2005-332773 | 12/2005 |

(Continued)

*Primary Examiner* — Anh Mai
*Assistant Examiner* — Hana Featherly
(74) *Attorney, Agent, or Firm* — Husch Blackwell LLP

(57) ABSTRACT

To reduce the thickness of a lighting device which uses an electroluminescent material and to simplify the structure of a lighting device which uses an electroluminescent material, in the lighting device of the present invention: a terminal electrically connecting a light-emitting element included in the lighting device to the outside is formed over the same surface of a substrate as the light-emitting element; and the terminal is formed at the center of the substrate while the light-emitting element is stacked. In addition, the lighting device has a structure in which the light-emitting element is not easily deteriorated.

19 Claims, 14 Drawing Sheets

(56) References Cited

U.S. PATENT DOCUMENTS

| | | |
|---|---|---|
| 2010/0237373 A1 | 9/2010 | Yamazaki et al. |
| 2010/0237805 A1 | 9/2010 | Yamazaki et al. |
| 2011/0169116 A1 | 7/2011 | Nanver et al. |
| 2011/0171763 A1 | 7/2011 | Lee et al. |
| 2013/0193473 A1 | 8/2013 | Yamazaki et al. |

FOREIGN PATENT DOCUMENTS

| | | |
|---|---|---|
| JP | 2007-5227 A | 1/2007 |
| JP | 2007-018768 A | 1/2007 |
| JP | 2007-173424 | 7/2007 |
| JP | 2007-173520 | 7/2007 |
| JP | 2007-294137 A | 11/2007 |
| JP | 2007-299674 A | 11/2007 |
| JP | 2008-034142 A | 2/2008 |
| JP | 2008-186618 A | 8/2008 |
| JP | 2008-218306 A | 9/2008 |
| JP | 2008-218309 A | 9/2008 |
| JP | 2009-545113 | 12/2009 |
| WO | WO 2008/012460 A2 | 1/2008 |

\* cited by examiner

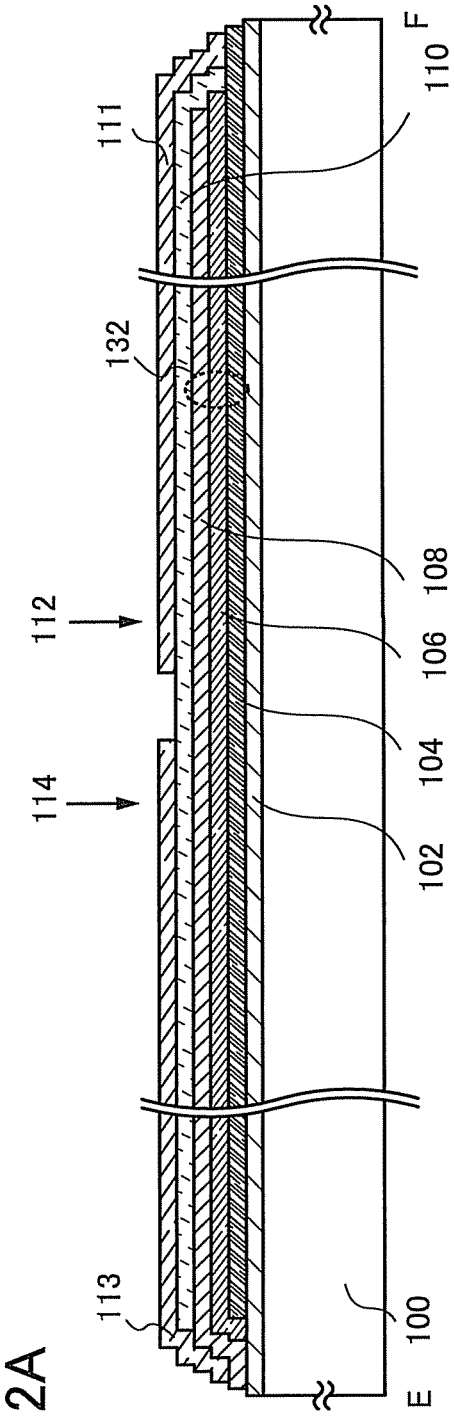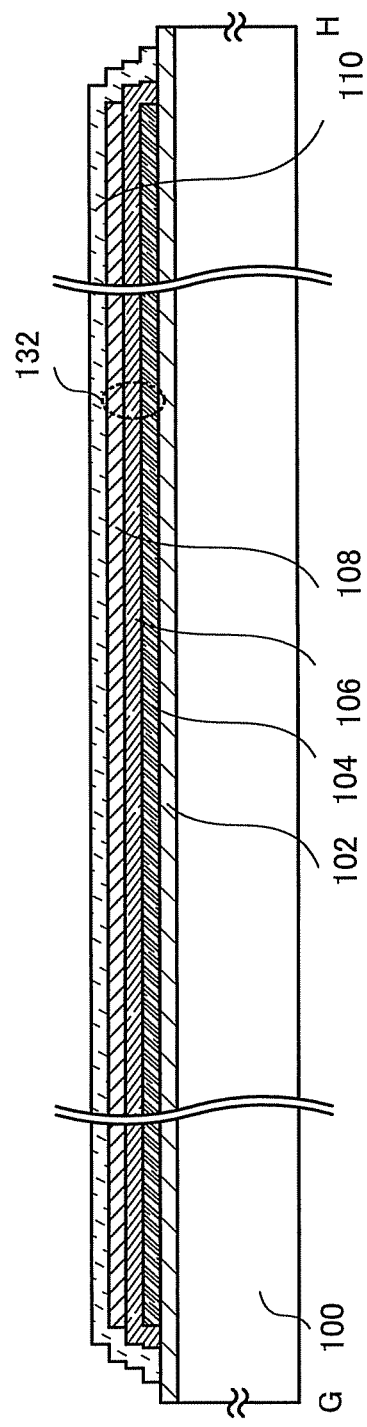

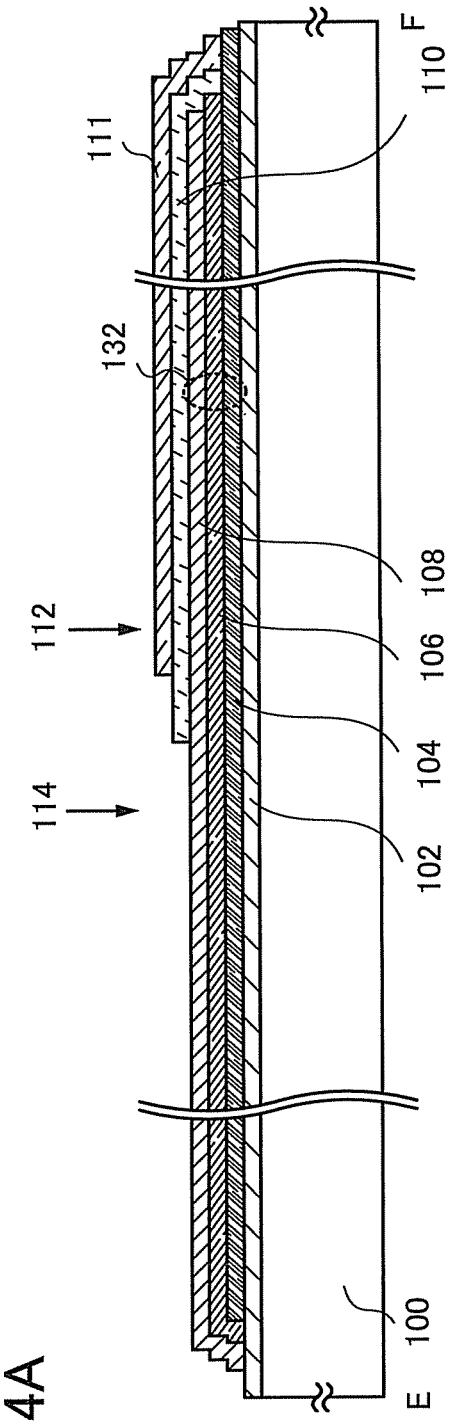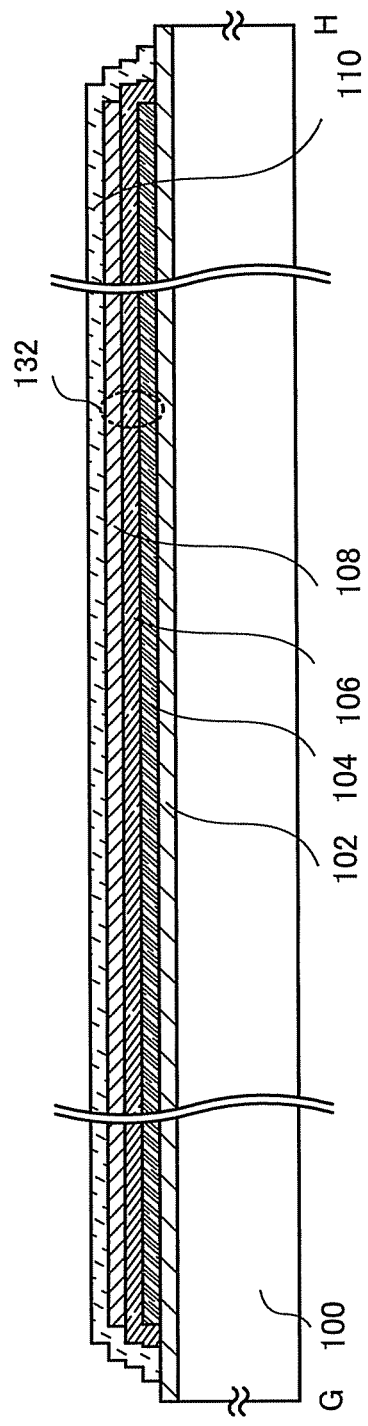

LIGHTING DEVICE

BACKGROUND OF THE INVENTION

1. Field of the Invention

One embodiment of the present invention relates to a lighting device including a light-emitting member which exhibits electroluminescence.

2. Description of the Related Art

As a next-generation lighting device, a lighting device using an electroluminescent material has attracted attention because it is estimated to have higher emission efficiency than filament bulbs or fluorescent bulbs. A thin film of an electroluminescent material can be formed to a thickness of 1 µm or less by evaporation or coating. Further, the structure of such a lighting device has been devised; for example, some inventions disclose a lighting device using an electroluminescent material in which the luminance is kept constant even when the area of the lighting device is increased (for example, see Patent Document 1).

Further, in order to reduce the load on an electroluminescent panel, a lighting device is disclosed in which an electroluminescent panel is formed into a ring shape to have an opening in its center (for example, see Patent Document 2). This lighting device has a structure in which a terminal is led from an electrode of the electroluminescent panel to the inner of the center opening so that the led terminal is connected to a driver circuit provided in a supporting member attached to the center.

In the lighting device having such a structure, a metal plate, a conductive wire, or the like needs to be attached to a thin film electrode by soldering or the like in order to lead the terminal of the thin film electrode of the electroluminescent panel to the inner of the center opening.

However, even when the metal plate or the conductive wire is attached to the thin film electrode, the thin film electrode has a problem in that it has low adhesion and thus is easily separated from a substrate. There is also a problem in that the thin film electrode and the lead terminal such as the metal plate or the conductive wire need to be additionally provided, leading to an increase in the number of components and a complicated structure. As a result, reduction in the thickness of a lighting device is prevented from being achieved even though an electroluminescent element is a thin film.

REFERENCE

Patent Documents

[Patent Document 1] Japanese Published Patent Application No. 2005-332773
[Patent Document 2] Japanese Published Patent Application No. 2007-173424

SUMMARY OF THE INVENTION

According to one embodiment of the present invention, an object is to reduce the thickness of a lighting device which uses an electroluminescent material. Alternatively, according to one embodiment of the present invention, an object is to simplify the structure of a lighting device which uses an electroluminescent material.

One embodiment of the present invention is a lighting device in which: a terminal electrically connecting a light-emitting element included in the lighting device to the outside is formed over the same surface of a substrate as the light-emitting element; and the terminal is formed at the center of the substrate while the light-emitting element is stacked. In addition, the lighting device has a structure in which the light-emitting element is not easily deteriorated.

One embodiment of the present invention is a lighting device including over one surface of a substrate having an insulating surface: a light-emitting element provided with a first electrode and a second electrode at least one of which has a light-transmitting property and an EL layer interposed between the first electrode and the second electrode; a protective layer which covers the light-emitting element and is provided with an opening at substantially the center of the substrate; and a first terminal portion extending from the first electrode and a second terminal portion extending from the second electrode which are provided in the opening of the protective layer.

In the above structure, the first terminal portion and the second terminal portion are provided in contact with the insulating surface of the substrate.

One embodiment of the present invention is a lighting device including over one surface of a substrate having an insulating surface: a light-emitting element provided with a first electrode and a second electrode each having a connecting portion at a peripheral portion of the substrate, at least one of which has a light-transmitting property, and an EL layer interposed between the first electrode and the second electrode; and a protective layer which covers the light-emitting element except for the connecting portions of the first electrode and the second electrode; a first auxiliary wiring led from the connecting portion of the first electrode to substantially the center of the substrate and a second auxiliary wiring led from the connecting portion of the second electrode to substantially the center of the substrate, which are provided over the protective layer; and a first terminal portion extending from the first auxiliary wiring and a second terminal portion extending from the second auxiliary wiring, which are provided at substantially the center of the substrate.

In each of the above structures, one surface of the substrate is provided with an insulating barrier layer.

In each of the above structures, the substrate has a round shape.

In each of the above structures, the EL layer includes at least two layers with an intermediate layer therebetween.

Note that the ordinal numbers such as "first" and "second" in this specification are used for convenience and do not limit the order of steps and the stacking order of layers. In addition, elements accompanied by ordinal numbers such as "first" and "second" do not denote particular names which specify the present invention.

The lighting device according to one embodiment of the present invention can be manufactured by a simple manufacturing process and therefore can be mass-produced. Further, since the lighting device according to one embodiment of the present invention has a structure in which element deterioration is not easily caused, a lighting device having long lifetime can be provided. In addition, in the lighting device according to one embodiment of the present invention, reduction in weight and film thickness is realized and electrical connection to an external power supply can be easily made; therefore, the lighting device can be used for various applications.

BRIEF DESCRIPTION OF THE DRAWINGS

In the accompanying drawings:

FIGS. 2A and 2B are cross-sectional views illustrating a lighting device;

FIGS. 4A and 4B are cross-sectional views illustrating a lighting device.

DETAILED DESCRIPTION OF THE INVENTION

Figure 1:
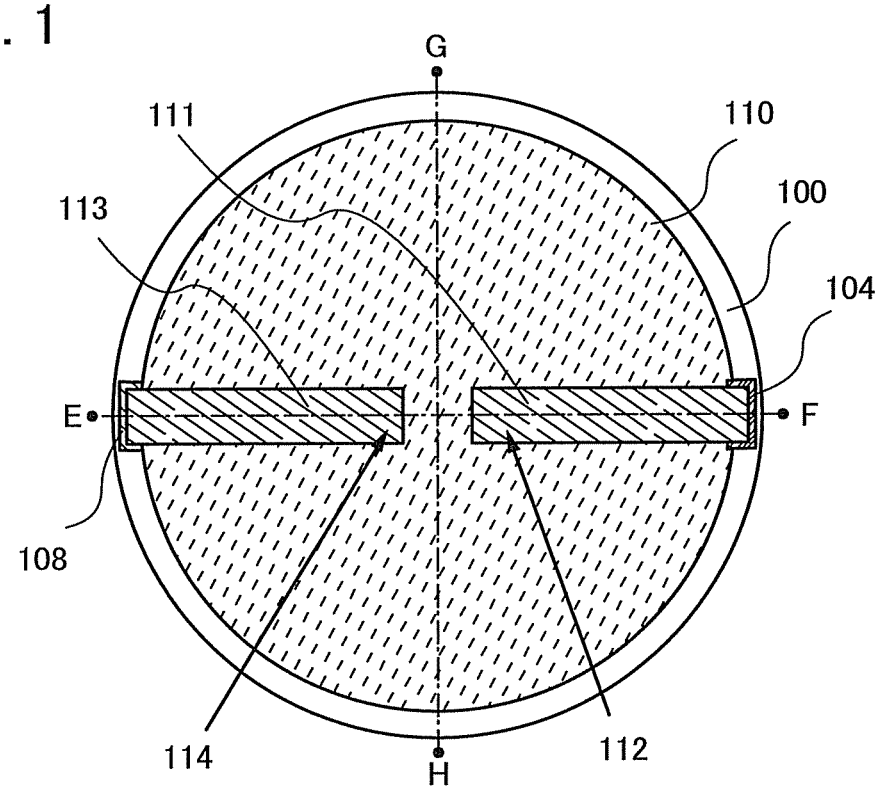
FIG. 1 is a plan view illustrating a lighting device.

Embodiments of the present invention will be described with reference to the drawings. However, the present invention is not limited to the following description, and various changes for the modes and details thereof will be apparent to those skilled in the art unless such changes depart from the spirit and the scope of the invention. Therefore, this invention is not interpreted as being limited to what is described in the embodiments below. In the structures to be given below, the same portions or portions having similar functions are denoted by the same reference numerals in different drawings, and explanation thereof will not be repeated.

Embodiment 1

In Embodiment 1, one embodiment of a lighting device of the present invention will be described with reference to FIG. 1 and FIGS. 2A and 2B.

FIG. 1 is a plan view of a lighting device. FIG. 2A is a cross-sectional view taken along line E-F of FIG. 1 and FIG. 2B is a cross-sectional view taken along line G-H of FIG. 1.

A light-emitting element 132 including a first electrode layer 104, an EL layer 106, and a second electrode layer 108 is formed over a substrate 100 which is provided with an insulating film 102 as a base protective film (a barrier layer). An insulating film 110 covers the light-emitting element 132 except for part of the first electrode layer 104 and part of the second electrode layer 108. The insulating film 110 functions as a sealing film or a protective film which protects the EL layer 106 of the light-emitting element from external contaminants such as water. Note that the substrate 100 has a round shape (a disk shape, a discus shape, or a circular shape) and is formed with a material over which a thin film for forming the light-emitting element 132 can be deposited.

Since the substrate 100 has a round shape, the insulating film 102, the first electrode layer 104, the EL layer 106, the second electrode layer 108 and the insulating film 110, which are stacked over the substrate 100, reflect the round shape so as to be formed in a nearly round shape.

The first electrode layer 104 and the second electrode layer 108 extend to a peripheral portion of the substrate 100 so as to be connected respectively to a first auxiliary wiring 111 and a second auxiliary wiring 113 which are formed over the insulating film 110. The extending regions of the first electrode layer 104 and the second electrode layer 108 are not covered with the insulating film 110 and are exposed. The exposed region of the first electrode layer 104 is a connecting portion of the first electrode layer 104 and the first auxiliary wiring 111. The exposed region of the second electrode layer 108 is a connecting portion of the second electrode layer 108 and the second auxiliary wiring 113.

The first auxiliary wiring 111 is formed in contact with the exposed and extending region of the first electrode layer 104; similarly, the second auxiliary wiring 113 is formed in contact with the exposed and extending region of the second electrode layer 108. The first auxiliary wiring 111 and the second auxiliary wiring 113 function as terminals of the lighting device for connection to a terminal of an external power supply and have a first connecting portion 112 (also referred to as a first terminal portion of the lighting device) and a second connecting portion 114 (also referred to as a second terminal portion of the lighting device) for connection to the terminal of the external power supply. The first auxiliary wiring 111 and the second auxiliary wiring 113 allow the first connecting portion 112 which is a connecting portion of the first electrode layer 104 and the second connecting portion 114 which is a connecting portion of the second electrode layer 108 to be provided over the same surface as the light-emitting element 132 and at the center of the round substrate. Note that in this specification, the "center" of a substrate or a lighting device refers to a region including the center and the vicinity of the center.

In peripheral portion E of the substrate 100: the first electrode layer 104 is formed over the insulating film 102; the EL layer 106 is stacked over the first electrode layer 104 so as to cover the end portion of the first electrode layer 104; and the second electrode layer 108 is formed over the EL layer 106 so as to cover the end portion of the EL layer 106 and to extend to the peripheral portion E side of the substrate 100. The insulating film 110 which is stacked over the second electrode layer 108 is not formed over the extending region of the second electrode layer 108 so that the extending region of the second electrode layer 108 is exposed. Being in contact with the exposed part of the second electrode layer 108, the second auxiliary wiring 113 is fainted over the insulating film 110 so as to extend to the center of the substrate 100. Thus, the second connecting portion 114 for connection to the external power supply can be formed at the center of the substrate 100 by providing the second auxiliary wiring 113 which is electrically connected to the second electrode layer 108.

In peripheral portion F of the substrate 100, the first electrode layer 104 is formed over the insulating film 102 so as to extend to the peripheral portion F side of the substrate 100. The EL layer 106 and the second electrode layer 108 are stacked over the first electrode layer 104. The insulating film 110 is formed over the EL layer 106 and the second electrode layer 108 so as to cover the end portions of the EL layer 106 and the second electrode layer 108. In the peripheral portion F of the substrate 100, the EL layer 106, the second electrode layer 108 and the insulating film 110 which are stacked over the first electrode layer 104 are not formed over the extending region of the first electrode layer 104 so that the extending region of the first electrode layer 104 is exposed. Being in contact with the exposed part of the first electrode layer 104, the first auxiliary wiring 111 is formed over the insulating film 110 so as to extend to the center of the substrate 100. Thus, the first connecting portion 112 for connection to the external power supply can be formed at the center of the substrate 100 by providing the first auxiliary wiring 111 which is electrically connected to the first electrode layer 104.

In peripheral portion G and peripheral portion H of the substrate 100: the first electrode layer 104 is formed over the insulating film 102; the EL layer 106 is formed over the first electrode layer 104 so as to cover the first electrode layer 104; and the second electrode layer 108 is formed over the EL layer 106. The insulating film 110 is formed over the first electrode layer 104, the EL layer 106 and the second electrode layer 108 so as to cover the end portions of the EL layer 106 and the second electrode layer 108.

Thus, the EL layer 106 is formed between the first electrode layer 104 and the second electrode layer 108 in the lighting device to prevent the first electrode layer 104 and the second electrode layer 108 from being in contact with each other. Further, the end portions of the EL layer 106 are covered with the insulating film 110 or the second electrode layer 108.

In this manner, short-circuit between the first electrode layer 104 and the second electrode layer 108 is not caused by a contact therebetween in the light-emitting element 132; therefore, the light-emitting element 132 can provide stable light emission. Moreover, the EL layer is prevented from being deteriorated by water or the like, which can improve the reliability of the lighting device.

The lighting device of this embodiment is a lighting device in which light emitted from the EL layer 106 transmits through the first electrode layer 104, the insulating film 102 and the substrate 100 to be extracted. Therefore, the first electrode layer 104, the insulating film 102 and the substrate 100 need to have light-transmitting properties so as to transmit the light emitted from the EL layer. Note that in this specification, a light-transmitting property refers to a property of transmitting light at least in a visible light region.

On the other hand, the second electrode layer 108, the insulating film 110, the first auxiliary wiring 111, and the second auxiliary wiring 113 do not necessarily need to have light-transmitting properties. When the second electrode layer 108 has reflectivity, the light from the EL layer 106 can be extracted more efficiently to the substrate 100 side.

As specific examples of a material used to form the substrate 100, there are plastic (a flexible substrate), glass, quartz, and the like. As examples of a plastic substrate, a plastic substrate or the like formed using polycarbonate, polyalylate, polyethersulfone, or the like can be given. Alternatively, a film (made of polypropylene, polyester, vinyl, polyvinyl fluoride, polyvinyl chloride, or the like), or an inorganic film formed by evaporation can be used. Note that other materials can also be used for the substrate 100 as long as they function as a support in the manufacturing process of the light-emitting element.

The size of the substrate 100 can be appropriately set depending on the usage of the lighting device; however, the size is preferably close to that of an optical disk device such as a CD-R (e.g., a disk shape with a diameter of 10 cm to 14 cm, preferably, 12 cm) because the lighting device is easily handled or the productivity thereof is increased.

Thus, the lighting device illustrated in FIG. 1 and FIGS. 2A and 2B can be a lighting device having a disk shape of 10 cm to 14 cm, preferably 12 cm in diameter and 1.2 mm to 1.5 mm in thickness.

The insulating film 102 which functions as the base protective film is formed with, for example, an inorganic compound to have a single-layer structure or a multi-layer structure. As a typical example of an inorganic compound, silicon oxide, silicon nitride, silicon oxynitride, silicon nitride oxide, or the like can be given. Further, as the insulating film 102, a film containing zinc sulfide and silicon oxide (a $ZnS.SiO_2$ film) may be used. Note that when silicon nitride, silicon nitride oxide, silicon oxynitride, or the like is used for the insulating film 102, moisture or gas such as oxygen can be prevented from entering the EL layer from the outside.

The insulating film 110 which functions as a protective film or a sealing film can be formed with, for example, an inorganic or organic compound to have a single-layer structure or a multi-layer structure. Here, the insulating film 110 is formed with an inorganic compound to have a single-layer structure or a multi-layer structure. Typical examples of an inorganic compound includes silicon oxide, silicon nitride, silicon oxynitride, silicon nitride oxide, aluminum nitride, aluminum oxynitride, aluminum nitride oxide, aluminum oxide, diamond-like carbon (DLC), or carbon containing nitrogen. Further, as the insulating film 110, a film containing zinc sulfide and silicon oxide (a $ZnS.SiO_2$ film) may be used.

As an organic compound, polyimide, acrylic, benzocyclobutene, polyimide, epoxy or the like can be used. Other than such organic materials, it is also possible to use a low-dielectric constant material (a low-k material), a siloxane-based resin, PSG (phosphosilicate glass), BPSG (borophosphosilicate glass), or the like.

Note that the siloxane-based resin corresponds to a resin including a Si—O—Si bond framed using a siloxane-based material as a starting material. The siloxane-based resin may include as a substituent an organic group (e.g., an alkyl group or an aryl group) or a fluoro group. In addition, the organic group may include a fluoro group.

For the first auxiliary wiring 111 and the second auxiliary wiring 113, a conductive material may be used. For example, each of the auxiliary wirings can be fanned to have a single-layer structure or a stacked-layer structure using material selected from aluminum (Al), titanium (Ti), tantalum (Ta), tungsten (W), molybdenum (Mo), chromium (Cr), neodymium (Nd), scandium (Sc), nickel (Ni) and copper (Cu), or an alloy material containing any of these as its main component. Alternatively, the first auxiliary wiring 111 and the second auxiliary wiring 113 may be formed with a conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

The lighting device of this embodiment can be manufactured by a simple manufacturing process and therefore can be mass-produced. Further, since the lighting device of this embodiment has a structure in which element deterioration is not easily caused, a lighting device having long lifetime can be provided. In addition, in the lighting device of this embodiment, reduction in weight and film thickness is realized and electrical connection to an external power supply can be easily made; therefore, the lighting device can be used for various applications.

Embodiment 2

In this embodiment, an example of a lighting device having a structure of an auxiliary wiring which is different from that of Embodiment 1 is described with reference to FIG. 3 and FIGS. 4A and 4B. That is, except the structure of the auxiliary wiring, the lighting device can be manufactured in a manner similar to Embodiment 1; thus, repetitive description of the same components as or components having functions similar to those in Embodiment 1 and manufacturing steps is omitted.

Figure 3:
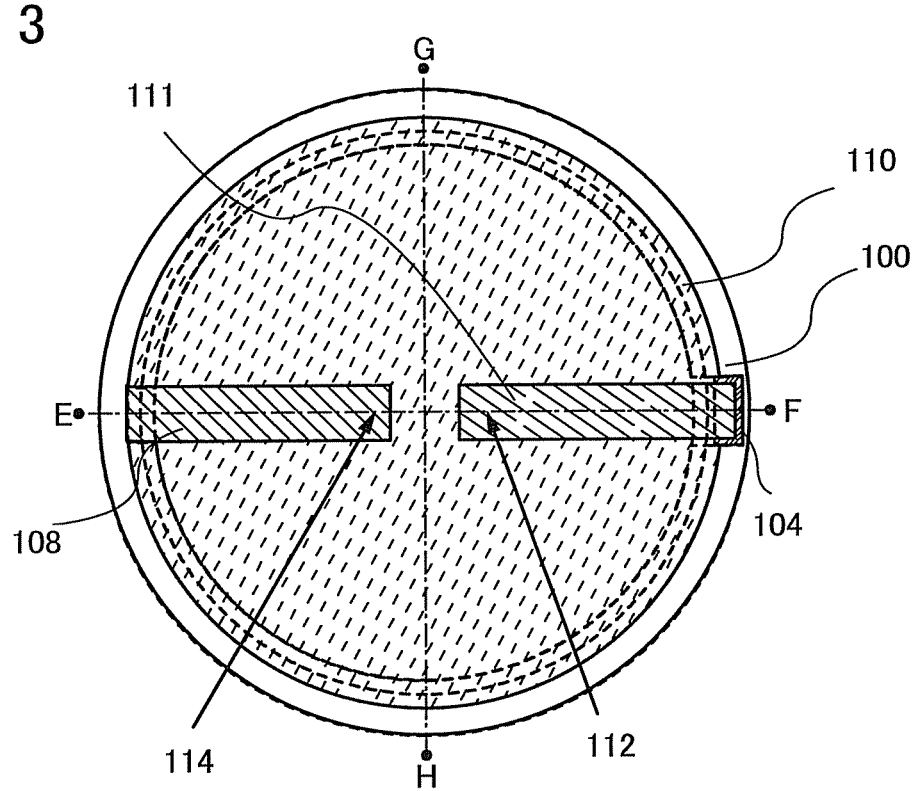
FIG. 3 is a plan view illustrating a lighting device.

FIG. 3 is a plan view of the lighting device. FIG. 4A illustrates a cross-sectional view taken along line E-F of FIG. 3 and FIG. 4B illustrates a cross-sectional view taken along line G-H of FIG. 3.

A light-emitting element 132 including the first electrode layer 104, the EL layer 106, and the second electrode layer 108 is formed over the substrate 100 which is provided with the insulating film 102 as a base protective film. The insulating film 110 covers the light-emitting element 132 except for part of the first electrode layer 104 and part of the second electrode layer 108.

The first electrode layer 104 extends to the peripheral portion of the substrate 100 so as to be connected to the first auxiliary wiring 111 which is formed over the insulating film 110. The extending region of the first electrode layer 104 is not covered with the insulating film 110 and is exposed. The first auxiliary wiring 111 is formed in contact with the exposed and extending region of the first electrode layer 104. The first auxiliary wiring 111 functions as a terminal of the lighting device for connection to a terminal of an external power supply and has the first connecting portion 112 for connection to the terminal of the external power supply.

Further, the insulating film 110 has an opening over the second electrode layer 108 and the opening of the insulating film 110 exposes the second electrode layer 108. The exposed part of the second electrode layer 108 functions as the terminal of the lighting device for connection to a terminal of an external power supply and has the second connecting portion 114 for connection to the terminal of the external power supply.

The first auxiliary wiring 111 and the second electrode layer 108 which is exposed by the opening of the insulating film 110 allow the first connecting portion 112 which is a connecting portion of the first electrode layer 104 and the second connecting portion 114 which is a connecting portion of the second electrode layer 108 to be provided over the same surface as the light-emitting element 132 and at the center of the round substrate 100.

In the peripheral portion E of the substrate 100: the first electrode layer 104 is formed over the insulating film 102; the EL layer 106 is stacked over the first electrode layer 104 so as to cover the end portion of the first electrode layer 104; and the second electrode layer 108 is formed over the EL layer 106 so as to cover the end portion of the EL layer 106. Over the second electrode layer 108, the insulating film 110 is formed and includes the opening that is formed so that the part of the second electrode layer 108 is exposed from the peripheral portion E to the center of the substrate. Thus, the second connecting portion 114 for connection to the external power supply can be formed at the center of the substrate 100 by using the second electrode layer 108.

In the peripheral portion F of the substrate 100, the first electrode layer 104 is formed over the insulating film 102 so as to extend to the peripheral portion F side of the substrate 100. The EL layer 106 and the second electrode layer 108 are stacked over the first electrode layer 104. The insulating film 110 is formed over the EL layer 106 and the second electrode layer 108 so as to cover the end portions of the EL layer 106 and the second electrode layer 108. In the peripheral portion F, the EL layer 106, the second electrode layer 108 and the insulating film 110 which are stacked over the first electrode layer 104 are not formed over the extending region of the first electrode layer 104 so that the extending region of the first electrode layer 104 is exposed. Being in contact with the exposed part of the first electrode layer 104, the first auxiliary wiring 111 is formed over the insulating film 110 so as to extend to the center of the substrate 100. Thus, the first connecting portion 112 for connection to the external power supply can be formed at the center of the substrate 100 by using the first auxiliary wiring 111 which is electrically connected to the first electrode layer 104.

In the peripheral portions G and H of the substrate 100: the first electrode layer 104 is formed over the insulating film 102; the EL layer 106 is formed over the first electrode layer 104 so as to cover the first electrode layer 104; and the second electrode layer 108 is formed over the EL layer 106. The insulating film 110 is formed over the first electrode layer 104, the EL layer 106 and the second electrode layer 108 so as to cover the end portions of the EL layer 106 and the second electrode layer 108.

Thus, the EL layer 106 is formed between the first electrode layer 104 and the second electrode layer 108 in the lighting device to prevent the first electrode layer 104 and the second electrode layer 108 from being in contact with each other. Further, the end portions of the EL layer 106 are covered with the insulating film 110 or the second electrode layer 108.

In this manner, short-circuit between the first electrode layer 104 and the second electrode layer 108 is not caused by a contact therebetween in the light-emitting element 132; therefore, the light-emitting element 132 can provide stable light emission. Moreover, the EL layer is prevented from being deteriorated by water or the like, which can improve the reliability of the lighting device.

As in this embodiment, the first connecting portion for connection to the external power supply may be formed by providing the first auxiliary wiring which is electrically connected to the first electrode layer of the light-emitting element; and the second connecting portion may be formed by formation of the opening in the insulating film. Alternatively, a plurality of first connecting portions and second connecting portions can be provided. As described above, there are a variety of structures to be employed for the lighting device which is provided with the connecting portion for connection to the external power supply; therefore, the structure is not limited to those shown in Embodiments 1 and 2.

The lighting device of this embodiment can be manufactured by a simple manufacturing process and therefore can be mass-produced. Further, since the lighting device of this embodiment has a structure in which element deterioration is not easily caused, a lighting device having long lifetime can be provided. In addition, in the lighting device of this embodiment, reduction in weight and film thickness is realized and electrical connection to an external power supply can be easily made; therefore, the lighting device can be used for various applications.

Embodiment 3

In this embodiment, an example of a lighting device in which no auxiliary wiring is used is described with reference to FIG. 5 and FIGS. 6A and 6B. That is, except the absence of auxiliary wirings, the thin film transistor can be formed in a manner similar to Embodiment 1; thus, repetitive description of the same components as or components having functions similar to those in Embodiments 1 and 2 and manufacturing steps is omitted.

Figure 5:
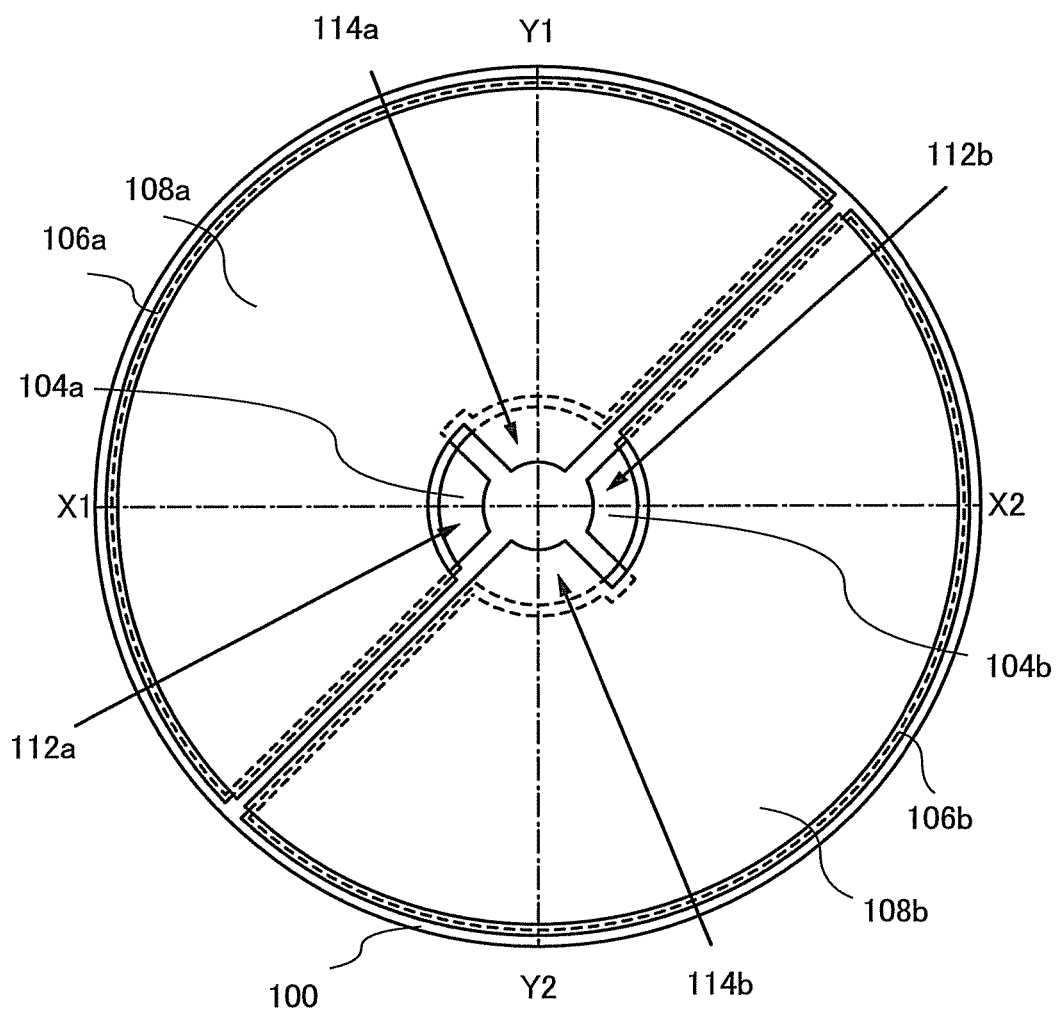
FIG. 5 is a plan view illustrating a lighting device.

FIG. 5 is a plan view of the lighting device. FIG. 6A is a cross-sectional view taken along line X1-X2 of FIG. 5 and FIG. 6B is a cross-sectional view taken along line Y1-Y2 of FIG. 5.

Figure 6A:
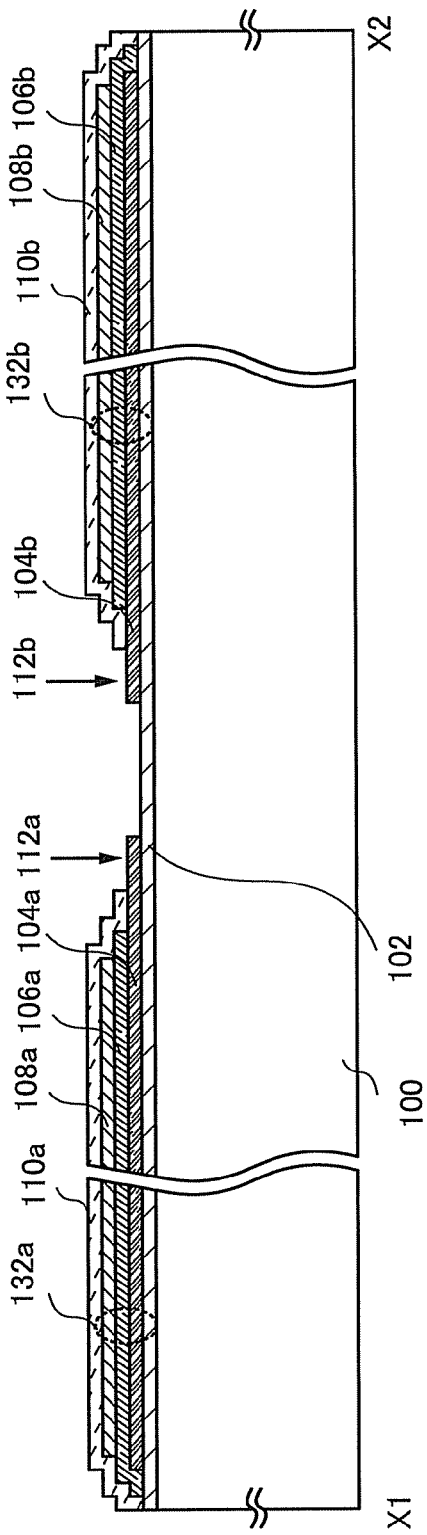
FIGS. 6A and 6B are cross-sectional views illustrating a lighting device.
Figure 6B:
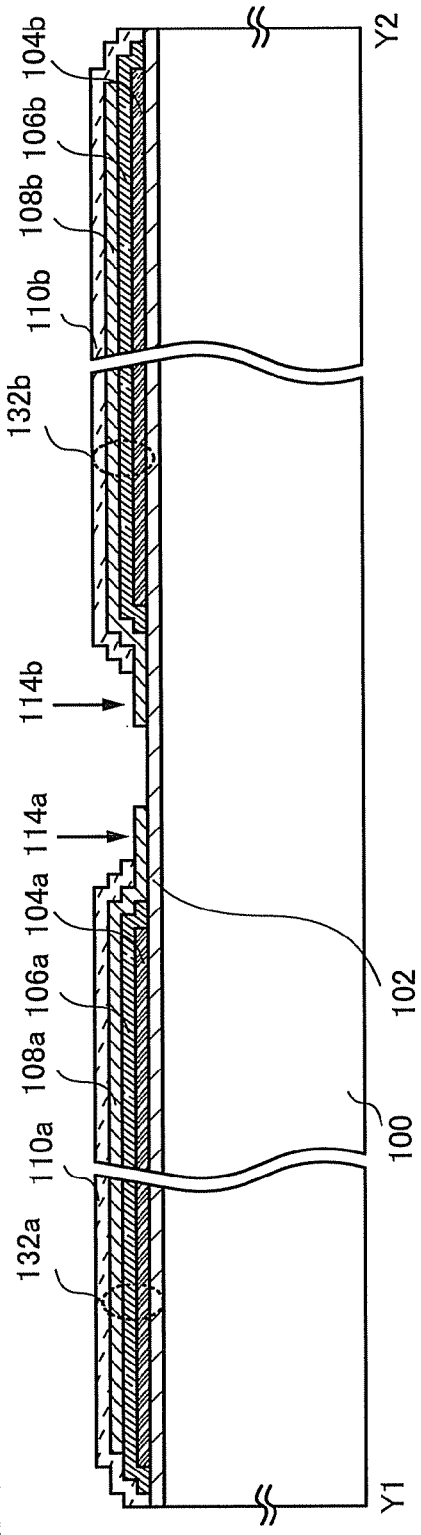

The lighting device illustrated in FIG. 5 and FIGS. 6A and 6B is provided with a plurality of light-emitting elements: a light-emitting element 132a and a light-emitting element 132*b*, each of which has a semicircular shape. At the center of the substrate 100, the light-emitting element 132*a* has a first connecting portion 112*a* and a second connecting portion 114*a* and the light-emitting element 132*b* has a first connecting portion 112*b* and a second connecting portion 114*b*.

The center of the substrate 100 is not provided with the light-emitting elements 132*a* and 132*b* but provided with the first connecting portions 112*a* and 112*b* and the second connecting portions 114*a* and 114*b*. The light-emitting element 132*a* has a stacked-layer structure including a first electrode layer 104*a*, an EL layer 106*a*, and a second electrode layer 108*a*. The light-emitting element 132*b* has a stacked-layer structure including a first electrode layer 104*b*, an EL layer 106*b*, and a second electrode layer 108*b*.

In the light-emitting element 132*a*, the first electrode layer 104*a* and the second electrode layer 108*a* extend to the center of the substrate 100. The extending regions of the first electrode layer 104*a* and the second electrode layer 108*a* are not covered with an insulating film 110*a* so as to be exposed, thereby forming the first connecting portion 112*a* and the second connecting portion 114*a*. Similarly, in the light-emitting element 132*b*, the first electrode layer 104*b* and the second electrode layer 108*b* extend to the center of the substrate 100. The extending regions of the first electrode layer 104*b* and the second electrode layer 108*b* are not covered with an insulating film 110*b* so as to be exposed, thereby forming the first connecting portion 112*b* and the second connecting portion 114*b*.

In FIG. 6A, at the center of the substrate 100 on the light-emitting element 132*a* side, the first electrode layer 104*a* is formed over the insulating film 102 so as to extend to the center of the substrate 100. The EL layer 106*a* and the second electrode layer 108*a* are stacked over the first electrode layer 104*a*. The insulating film 110*a* is formed over the EL layer 106*a* and the second electrode layer 108*a* so as to cover the end portions of the EL layer 106*a* and the second electrode layer 108*a*. The EL layer 106*a*, the second electrode layer 108*a* and the insulating film 110*a* which are stacked over the first electrode layer 104*a* are not formed over the extending region of the first electrode layer 104*a* so that the extending region of the first electrode layer 104*a* is exposed, thereby forming the first connecting portion 112*a*. Similarly, at the center of the substrate 100 on the light-emitting element 132*b* side, the first electrode layer 104*b* is formed over the insulating film 102 so as to extend to the center of the substrate 100. The EL layer 106*b* and the second electrode layer 108*b* are stacked over the first electrode layer 104*b*. The insulating film 110*b* is formed over the EL layer 106*b* and the second electrode layer 108*b* so as to cover the end portions of the EL layer 106*b* and the second electrode layer 108*b*. The EL layer 106*b*, the second electrode layer 108*b* and the insulating film 110*b* which are stacked over the first electrode layer 104*b* are not formed over the extending region of the first electrode layer 104*b* so that the extending region of the first electrode layer 104*b* is exposed, thereby forming the first connecting portion 112*b*.

In FIG. 6B, at the center of the substrate 100 on the light-emitting element 132*a* side: the first electrode layer 104*a* is formed over the insulating film 102; the EL layer 106*a* is stacked over the first electrode layer 104*a* so as to cover the end portion of the first electrode layer 104*a*; and the second electrode layer 108*a* is formed over the EL layer 106*a* so as to cover the end portion of the EL layer 106*a* and to extend to the center of the substrate 100. The insulating film 110*a* which is stacked over the second electrode layer 108*a* is not formed over the extending region of the second electrode layer 108*a* so that the extending region of the second electrode layer 108*a* is exposed, thereby forming the second connecting portion 114*a*. Similarly, at the center of the substrate 100 on the light-emitting element 132*b* side, the first electrode layer 104*b* is formed over the insulating film 102; the EL layer 106*b* is stacked over the first electrode layer 104*b* so as to cover the end portion of the first electrode layer 104*b*; and the second electrode layer 108*b* is formed over the EL layer 106*b* so as to cover the end portion of the EL layer 106*b* and to extend to the center of the substrate 100. The insulating film 110*b* which is stacked over the second electrode layer 108*b* is not formed over the extending region of the second electrode layer 108*b* so that the extending region of the second electrode layer 108*b* is exposed, thereby forming the second connecting portion 114*b*.

In peripheral portion X1 and peripheral portion Y1 of the substrate 100: the first electrode layer 104*a* is formed over the insulating film 102; the EL layer 106*a* is formed over the first electrode layer 104*a* so as to cover the first electrode layer 104*a*; and the second electrode layer 108*a* is formed over the EL layer 106*a*. The insulating film 110*a* is formed over the first electrode layer 104*a*, the EL layer 106*a* and the second electrode layer 108*a* so as to cover the end portions of the EL layer 106*a* and the second electrode layer 108*a*. Similarly, in peripheral portion X2 and peripheral portion Y2 of the substrate 100: the first electrode layer 104*b* is formed over the insulating film 102; the EL layer 106*b* is formed over the first electrode layer 104*b* so as to cover the first electrode layer 104*b*; and the second electrode layer 108*b* is formed over the EL layer 106*b*. The insulating film 110*b* is formed over the first electrode layer 104*b*, the EL layer 106*b* and the second electrode layer 108*b* so as to cover the end portions of the EL layer 106*b* and the second electrode layer 108*b*.

Thus, in the lighting device, the EL layer 106*a* is formed between the first electrode layer 104*a* and the second electrode layer 108*a* to prevent the first electrode layer 104*a* and the second electrode layer 108*a* from being in contact with each other; and the EL layer 106*b* is formed between the first electrode layer 104*b* and the second electrode layer 108*b* to prevent the first electrode layer 104*b* and the second electrode layer 108*b* from being in contact with each other. Further, the end portions of the EL layer 106*a* are covered with the insulating film 110*a* or the second electrode layer 108*a* and the end portions of the EL layer 106*b* are covered with the insulating film 110*b* or the second electrode layer 108*b*.

In this manner, short-circuit between the first electrode layer 104*a* and the second electrode layer 108*a* is not caused by a contact therebetween in the light-emitting element 132*a*; and short-circuit between the first electrode layer 104*b* and the second electrode layer 108*b* is not caused by a contact therebetween in the light-emitting element 132*b*. Therefore, the light-emitting elements 132*a* and 132*b* can provide stable light emission. Moreover, the EL layers 106*a* and 106*b* are prevented from being deteriorated by water or the like, which can improve the reliability of the lighting device.

The lighting device of this embodiment can be manufactured by a simple manufacturing process and therefore can be mass-produced. Further, since the lighting device of this embodiment has a structure in which element deterioration is not easily caused, a lighting device having long lifetime can be provided. In addition, in the lighting device of this embodiment, reduction in weight and film thickness is realized and electrical connection to an external power supply can be easily made; therefore, the lighting device can be used for various applications.

Embodiment 4

Figure 7:
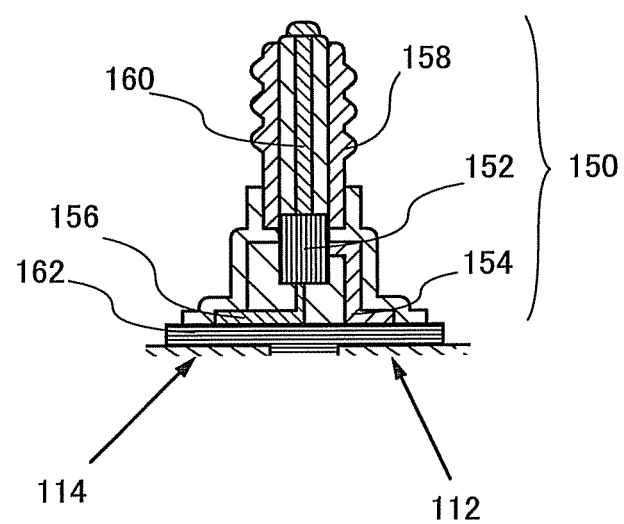
FIG. 7 is a diagram illustrating a connection structure of a lighting device and a connecting member.
Figure 8A:
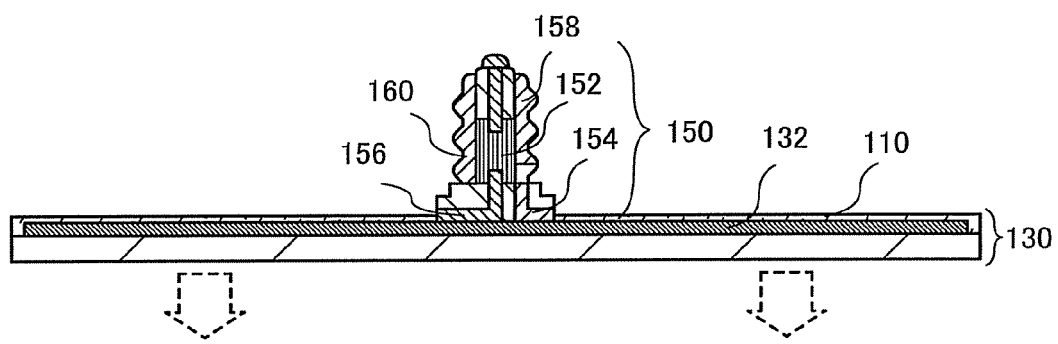
FIGS. 8A and 8B are diagrams each illustrating a connection structure of a lighting device and a connecting member.
Figure 8B:
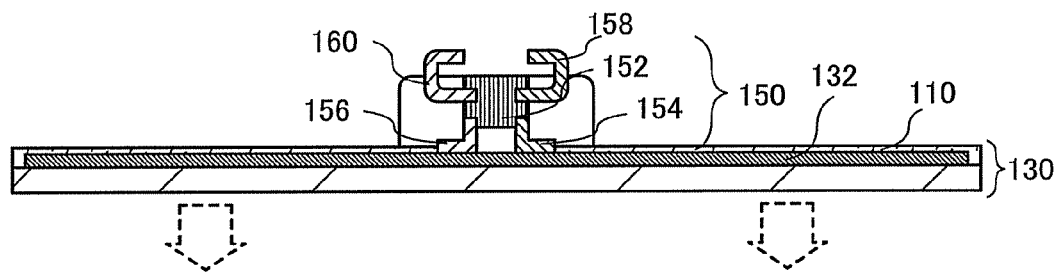

In this embodiment, with reference to FIG. 7 and FIGS. 8A and 8B, an example is shown in which the lighting device described in any of Embodiments 1 to 3 is provided with a connecting member so that the lighting device is connected to an external power supply.

In each of FIGS. 8A and 8B, an example of the lighting device provided with a connecting member is illustrated. In FIG. 7, the connecting portions in which the lighting device and the connecting member are connected is illustrated in detail.

In FIGS. 8A and 8B, a connecting member 150 (also referred to as a base) is attached to a lighting device 130. The connecting member 150 includes a control circuit 152, a first connecting wiring 154, a second connecting wiring 156, a first extraction wiring 158, and a second extraction wiring 160. The lighting device 130 includes the light-emitting element 132 and the insulating film 110 seals the lighting device 130 except for the connecting portions. The lighting device described in any of Embodiments 1 to 3 can be applied to the lighting device 130. The connecting member 150 may have a diameter of 10 mm to 40 mm, typically a diameter of about 25 mm. Since the connecting portions connected to the connecting member are provided at the center of the light-emitting device described in any of Embodiments 1 to 3, the connecting member can be attached to the center of the lighting device.

As illustrated in FIG. 7, the connecting member 150 is electrically connected, through an anisotropic conductive film 162, to the first connecting portion 112 and the second connecting portion 114 which are respectively connected to the first electrode layer and the second electrode layer of the light-emitting element 132 in the lighting device 130. Electrical connections are made between the first connecting portion 112 and the first extraction wiring 158 through the first connecting wiring 154 and the control circuit 152, and between the second connecting portion 114 and the second extraction wiring 160 through the second connecting wiring 156 and the control circuit 152. The connecting member 150 is connected to the external power supply, whereby the lighting device can be supplied with power from the external power supply and be turned on.

The control circuit 152 has a function of making the light-emitting element 132 emit light with a constant luminance on the basis of a power source voltage supplied from an external power source. The control circuit 152 includes, for example, a rectifying and smoothing circuit, a constant voltage circuit, and a constant current circuit. The rectifying and smoothing circuit is a circuit for converting an AC voltage supplied from an external AC power source into a DC voltage. The rectifying and smoothing circuit may be formed by, for example, a combination of a diode bridge circuit, a smoothing capacitor, and the like. The constant voltage circuit is a circuit for stabilizing a DC voltage having ripples output from the rectifying and smoothing circuit and outputting a constant voltage. The constant voltage circuit may be formed by a switching regulator, a series regulator, or the like. The constant current circuit is a circuit for outputting a constant current to the light-emitting element 132 in accordance with the voltage of the constant voltage circuit. The constant current circuit may be formed by a transistor or the like. Note that the rectifying and smoothing circuit is provided on the assumption that a commercial AC power source is used as the external power source; however, the rectifying and smoothing circuit is not necessarily provided in the case of using a DC power source as the external power source. The control circuit 152 may be provided with a circuit for controlling luminance, a protective circuit for protection against surge, or the like as needed.

In FIG. 7, an example is illustrated in which the anisotropic conductive film 162 is used to connect the connecting member 150 and the connecting portions of the lighting device 130; however, any of other methods or structures can be employed as long as it can electrically connect the connecting member 150 to the connecting portions of the lighting device 130. For example, conductive films used in the connecting member 150 and the connecting portions of the lighting device 130 may be formed with a material capable of being connected by soldering so that the connecting member 150 and the connecting portions of the lighting device 130 are connected by soldering.

The connecting member 150 illustrated in FIG. 8A and that illustrated in FIG. 8B differ from each other in their shape. That is, the connecting member 150 can be formed in various shapes as long as it is provided with a connecting wiring capable of being electrically connected to the lighting device 130 and an extraction wiring capable of supplying power from the external power supply.

The lighting device of this embodiment can be manufactured by a simple manufacturing process and therefore can be mass-produced. Further, since the lighting device of this embodiment has a structure in which element deterioration is not easily caused, a lighting device having long lifetime can be provided. In addition, in the lighting device of this embodiment, reduction in weight and film thickness is realized and electrical connection to an external power supply can be easily made; therefore, the lighting device can be used for various applications.

Embodiment 4 can be implemented in appropriate combination with the structures described in the other embodiments.

Embodiment 5

In this embodiment, with reference to FIGS. 9A and 9B and FIGS. 10A and 10B, another example is illustrated in which the lighting device described in any of the Embodiments 1 to 3 is provided with a connecting member so that the lighting device is connected to an external power supply.

Figure 9A:
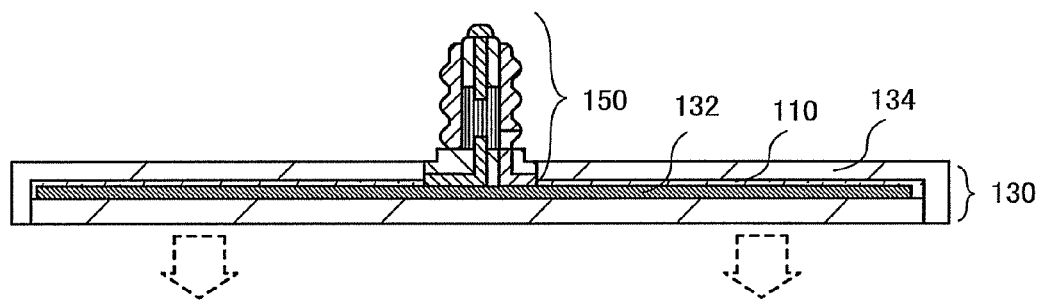
FIGS. 9A and 9B are diagrams each illustrating a connection structure of a lighting device and a connecting member.
Figure 9B:
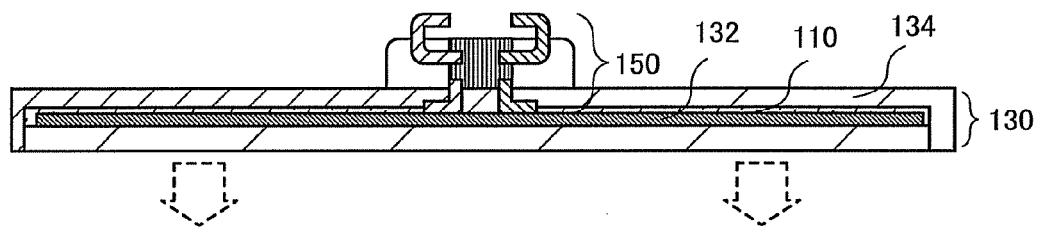

In FIGS. 9A and 9B, an example of the lighting device provided with a connecting member is illustrated. In the example, a sealing substrate 134 is further provided over the insulating film 110 of the lighting device 130 in FIGS. 8A and 8B so that the light-emitting element 132 is sealed.

The light-emitting element 132 is sealed between the sealing substrate 134 and the substrate 100, whereby external moisture or a substance deteriorating the light-emitting element can be further prevented from entering the light-emitting element 132. In addition, external physical damage can be relieved and therefore the physical strength of the lighting device can be improved. Since the reliability of the lighting device is improved in the above described manner, there are more environmental conditions under which the lighting device can be used; and the lighting device can be used for various applications.

Figure 10A:
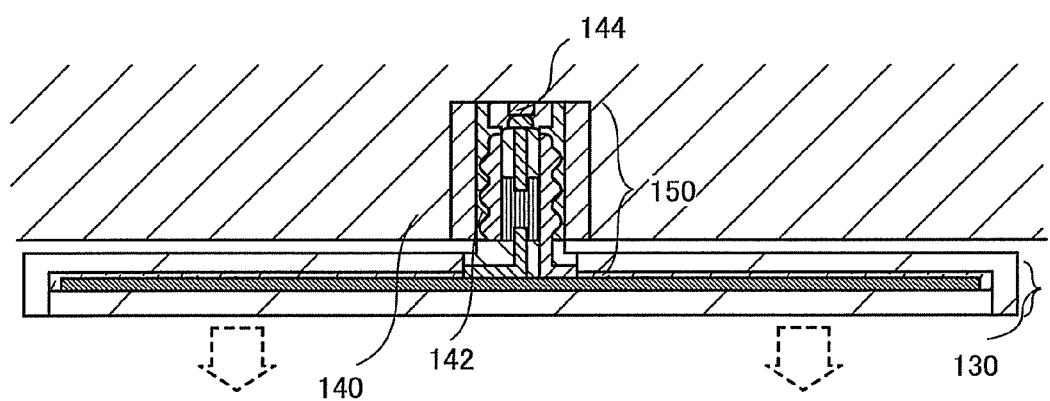
FIGS. 10A and 10B are diagrams each illustrating an example of application of a lighting device.
Figure 10B:
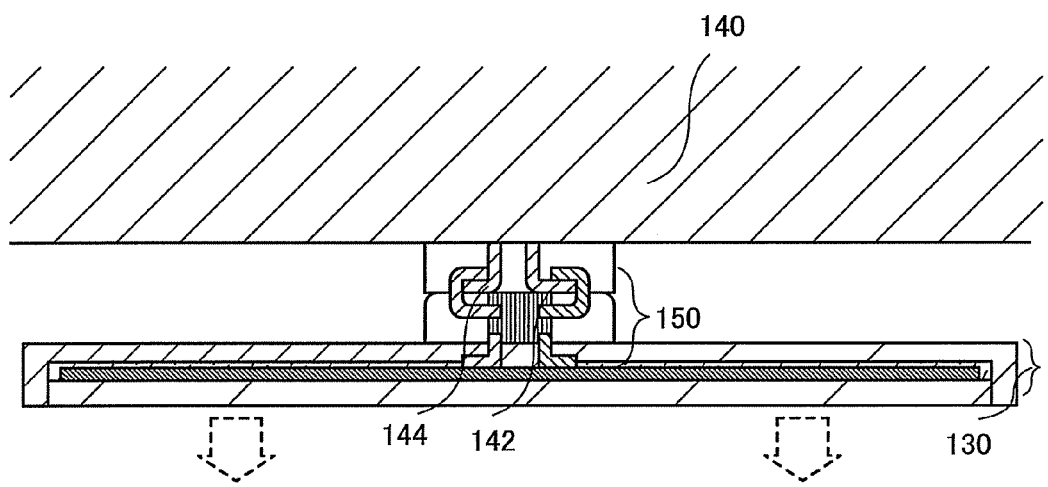

Each of FIGS. 10A and 10B illustrates an example of application of the lighting device 130 provided with the connecting member 150 which is illustrated in FIGS. 9A and 9B. The connecting member 150 is, depending on its shape, attached to the ceiling 140 by screwing as illustrated in FIG. 10A or by hanging as illustrated in FIG. 10B (which is also referred to as twist locking socket). In each of FIGS. 10A and 10B, the first extraction wiring and the second extraction wiring of the connecting member 150 are electrically connected to a first external electrode 142 and a second external electrode 144 respectively so that the lighting device 130 is supplied with power.

It is preferable that the sealing substrate 134 have a shape similar to that of the substrate 100 which faces the sealing substrate 134 with the light-emitting element 132 interposed therebetween; and the preferable shape is a round shape (a disk shape, a discus shape, or a circular shape). The sealing substrate 134 has an opening for attachment of the connecting member 150. It is preferable that the sealing substrate 134 have a depressed cross-section so that the lighting device 130 is fit to the inner of the sealing substrate 134, as illustrated in FIGS. 9A and 9B. A hygroscopic substance serving as a drying agent may be deposited on the surface of the sealing substrate 134 on the lighting device 130 side. For example, a film of a hygroscopic substance such as barium oxide may be formed on the sealing substrate 134 by sputtering. Alternatively, such a film serving as a drying agent may be formed over the insulating film 110.

As specific examples of a material used to form the sealing substrate 134, there are plastic (a flexible substrate), glass, quartz, ceramic, metal, and the like. As examples of a plastic substrate, a plastic substrate or the like formed using polycarbonate, polyalylate, polyethersulfone, or the like can be given. Alternatively, a film (made of polypropylene, polyester, vinyl, polyvinyl fluoride, polyvinyl chloride, or the like), or an inorganic film formed by evaporation can be used. Note that other materials can also be used as long as they function as the sealing substrate of the light-emitting element.

The lighting device of this embodiment can be manufactured by a simple manufacturing process and therefore can be mass-produced. Further, since the lighting device of this embodiment has a structure in which element deterioration is not easily caused, a lighting device having long lifetime can be provided. In addition, in the lighting device of this embodiment, reduction in weight and film thickness is realized and electrical connection to an external power supply can be easily made; therefore, the lighting device can be used for various applications.

Embodiment 6

In this embodiment, an example of an element structure of the light-emitting element included in the lighting device which is one embodiment of the present invention.

Figure 11A:
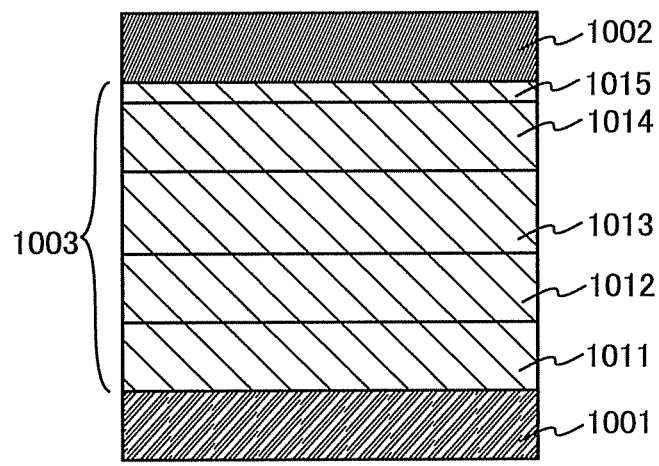
FIGS. 11A and 11B are diagrams each illustrating an example of a light-emitting element which is applicable to a lighting device.

In an element structure illustrated in FIG. 11A, an EL layer 1003 including a light-emitting region is sandwiched between a pair of electrodes (an anode 1001 and a cathode 1002).

The EL layer 1003 includes at least a light-emitting layer 1013, and may have a stacked-layer structure including a functional layer in addition to the light-emitting layer 1013. Examples of the functional layer other than the light-emitting layer 1013 include a layer containing a substance having a high hole-injecting property, a substance having a high hole-transporting property, a substance having a high electron-transporting property, a substance having a high electron-injecting property, a bipolar substance (a substance having high electron and hole transporting properties), or the like. Specifically, functional layers such as a hole-injecting layer 1011, a hole-transporting layer 1012, a light-emitting layer 1013, an electron-transporting layer 1014, and an electron-injecting layer 1015 can be used in combination as appropriate.

Next, materials that can be used for the aforementioned light-emitting element will be specifically described.

The anode 1001 is preferably made of a metal, an alloy, a conductive compound, a mixture thereof, or the like that has a high work function (specifically, a work function of 4.0 eV or higher). Specifically, it is possible to use, for example, conductive metal oxide such as indium oxide-tin oxide (ITO: indium tin oxide), indium oxide-tin oxide containing silicon or silicon oxide, indium oxide-zinc oxide (IZO: indium zinc oxide), or indium oxide containing tungsten oxide and zinc oxide.

These conductive metal oxide films are generally deposited by sputtering, but may also be formed by application of a sol-gel method or the like. For example, a film of indium oxide-zinc oxide (IZO) can be formed by sputtering using a target in which 1 wt % to 20 wt % of zinc oxide is added to indium oxide. Further, a film of indium oxide containing tungsten oxide and zinc oxide can be formed by sputtering using a target in which 0.5 wt % to 5 wt % of tungsten oxide and 0.1 wt % to 1 wt % of zinc oxide are added to indium oxide.

Besides, as a material used for the anode 1001, it is also possible to use gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (such as titanium nitride), molybdenum oxide, vanadium oxide, ruthenium oxide, tungsten oxide, manganese oxide, titanium oxide, or the like.

The cathode 1002 can be made of a metal, an alloy, a conductive compound, a mixture thereof, or the like that has a low work function (specifically, a work function of 3.8 eV or lower). Specific examples of the material for the cathode 1002 include an element belonging to Group 1 or Group 2 of the periodic table, i.e., an alkali metal such as lithium (Li) or cesium (Cs), an alkaline earth metal such as magnesium (Mg), calcium (Ca), or strontium (Sr), and an alloy containing these elements (e.g., MgAg or AlLi); and a rare earth metal such as europium (Eu) or ytterbium (Yb), and an alloy thereof. A film of an alkali metal, an alkaline earth metal, or an alloy containing such a metal can be formed by vacuum evaporation. An alloy film containing an alkali metal or an alkaline earth metal can also be formed by sputtering. Alternatively, silver paste or the like can be deposited by ink-jet or the like.

Alternatively, the cathode 1002 can be formed by a stack of a thin film of an alkali metal compound, an alkaline earth metal compound, or a rare earth metal compound (e.g., lithium fluoride (LiF), lithium oxide (LiO$_x$), cesium fluoride (CsF), calcium fluoride (CaF$_2$), or erbium fluoride (ErF$_3$)) and a film of a metal such as aluminum.

In the light-emitting element shown in this embodiment, at least one of the anode 1001 and the cathode 1002 may have light-transmitting properties.

Next, specific examples of the material used for each layer of the EL layer 1003 will be described below.

The hole-injecting layer 1011 is a layer containing a substance with a high hole-injecting property. As the substance with a high hole-injecting property, for example, molybdenum oxide, vanadium oxide, ruthenium oxide, tungsten oxide, or manganese oxide can be used. Alternatively, the hole-injecting layer 1011 can be made of a phthalocyanine-based compound such as phthalocyanine (abbreviation: H$_2$Pc) or copper phthalocyanine (abbreviation: CuPc); an aromatic amine compound such as 4,4'-bis[N-(4-diphenylaminophenyl)-N-phenylamino]biphenyl (abbreviation: DPAB) or N,N'-bis[4-[bis(3-methylphenyl)amino]phenyl]-N,N'-diphenyl-[1,1'-biphenyl]-4,4'-diamine (abbreviation: DNTPD); a high molecular compound such as poly(3,4-ethylenedioxythiophene)/poly(styrenesulfonic acid) (PEDOT/

PSS); or the like. Further alternatively, the hole-injecting layer 1011 can be made of a tris(p-enamine-substituted-aminophenyl)amine compound, a 2,7-diamino-9-fluorenylidene compound, a trip-N-enamine-substituted-aminophenyl)benzene compound, a pyrene compound having one or two ethenyl groups having at least one aryl group, N,N'-di(biphenyl-4-yl)-N,N'-diphenylbiphenyl-4,4'-diamine, N,N,N',N'-tetra(biphenyl-4-yl)biphenyl-4,4'-diamine, N,N,N',N'-tetra(biphenyl-4-yl)-3,3'-diethylbiphenyl-4,4'-diamine, 2,2'-(methylenedi-4,1-phenylene)bis[4,5-bis(4-methoxyphenyl)-2H-1,2,3-triazole], 2,2'-(biphenyl-4,4'-diyl)bis(4,5-diphenyl-2H-1,2,3-triazole), 2,2'-(3,3'-dimethylbiphenyl-4,4'-diyl)bis(4,5-diphenyl-2H-1,2,3-triazole), bis[4-(4,5-diphenyl-2H-1,2,3-triazol-2-yl)phenyl](methyl)amine, or the like.

The hole-injecting layer 1011 can also be formed of a hole-injecting composite material including an organic compound and an inorganic compound (preferably, an inorganic compound having electron-accepting properties to an organic compound). Since electrons are transferred between the organic compound and the inorganic compound, the hole-injecting composite material has a high carrier density, and thus has excellent hole-injecting properties and hole-transporting properties.

In the case where the hole-injecting layer 1011 is made of a hole-injecting composite material, the hole-injecting layer 1011 can form an ohmic contact with the anode 1001; thus, the material of the anode 1001 can be selected regardless of the work function.

The inorganic compound used for the hole-injecting composite material is preferably an oxide of a transition metal. Further, an oxide of metals belonging to Group 4 to Group 8 of the periodic table can also be used. Specifically, vanadium oxide, niobium oxide, tantalum oxide, chromium oxide, molybdenum oxide, tungsten oxide, manganese oxide, and rhenium oxide are preferably used because of their high electron-accepting properties. Among them, molybdenum oxide is especially preferable because it is stable in the air and has a low hygroscopic property, thereby being easily handled.

As the organic compound used for the hole-injecting composite material, it is possible to use various compounds such as an aromatic amine compound, a carbazole derivative, an aromatic hydrocarbon, and a high molecular compound (oligomer, dendrimer, polymer, or the like). Note that the organic compound used for the hole-injecting composite material is preferably an organic compound with a high hole-transporting property. Specifically, it is preferable to use a substance having a hole mobility of $10^{-6}$ cm$^2$/Vs or higher, though other substances may also be used as long as the hole-transporting properties thereof are higher than the electron-transporting properties thereof. The organic compounds that can be used for the hole-injecting composite material are specifically described below.

Examples of the aromatic amine compound include: N,N'-di(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); N,N'-bis[4-[bis(3-methylphenyl)amino]phenyl]-N,N'-diphenyl-[1,1'-biphenyl]-4,4'-diamine abbreviation: DNTPD); and 1,3,5-tris[N-(4-diphenylaminophenyl)-N-phenylamino]benzene (abbreviation: DPA3B).

Specific examples of the carbazole derivative used for the hole-injecting composite material include: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); and 3-[N-(1-naphthyl)-N-(9-phenylcarbazol-3-yl)amino]-9-phenylcarbazole (abbreviation: PCzPCN1).

Further, it is also possible to use: 4,4'-di(N-carbazolyl)biphenyl (abbreviation: CBP); 1,3,5-tris[4-(N-carbazolyl)phenyl]benzene (abbreviation: TCPB); 9-[4-(N-carbazolyl)]phenyl-10-phenylanthracene (abbreviation: CzPA); 1,4-bis[4-(N-carbazolyl)phenyl]-2,3,5,6-tetraphenylbenzene; or the like.

Examples of the aromatic hydrocarbon used for the hole-injecting composite material include: 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; and 2,5,8,11-tetra(tert-butyl)perylene. Besides, pentacene, coronene, or the like can also be used. As described above, it is more preferable to use an aromatic hydrocarbon that has a hole mobility of $1\times10^{-6}$ cm$^2$/Vs or higher and has 14 to 42 carbon atoms.

The aromatic hydrocarbon used for the hole-injecting composite material may have a vinyl skeleton. Examples of the aromatic hydrocarbon having a vinyl skeleton include 4,4'-bis(2,2-diphenylvinyl)biphenyl (abbreviation: DPVBi) and 9,10-bis[4-(2,2-diphenylvinyl)phenyl]anthracene (abbreviation: DPVPA).

It is also possible to use a high molecular compound such as poly(N-vinylcarbazole) (abbreviation: PVK) or poly(4-vinyltriphenylamine) (abbreviation: PVTPA).

The hole-transporting layer 1012 is a layer containing a substance having a high hole-transporting property. The substance having a high hole-transporting property is preferably an aromatic amine compound (i.e., a compound having a benzene ring-nitrogen bond), for example. Widely used examples of the material are as follows: 4,4'-bis[N-(3-methylphenyl)-N-phenylamino]biphenyl; a derivative thereof such as 4,4'-bis[N-(1-napthyl)-N-phenylamino]biphenyl (hereinafter referred to as NPB); and a starburst aromatic amine compound such as 4,4',4''-tris(N,N-diphenyl-amino)triphenylamine or 4,4',4''-tris[N-(3-methylphenyl)-N-phenylamino]triphenylamine. These substances are mainly substances having a hole mobility of $10^{-6}$ cm$^2$/Vs or higher, though other substances may also be used as long as the hole-transporting properties thereof are higher than the electron-transporting properties thereof. Note that the hole-transporting layer 1012 is not limited to a single layer, but may be a mixed layer of the aforementioned substances, or stacked layers of two or more layers containing the aforementioned substances.

Alternatively, a hole-transporting material may be added to a high molecular compound such as PMMA, which is electrically inactive.

It is also possible to use a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation:

PTPDMA), or poly[N,N'-bis(4-butylphenyl)-N,N'-bis(phenyl)benzidine] (abbreviation: Poly-TPD). Furthermore, the aforementioned hole-transporting material may be added to those high molecular compounds as appropriate. Further alternatively, the hole-transporting layer 1012 can be made of a tris(p-enamine-substituted-aminophenyl)amine compound, a 2,7-diamino-9-fluorenylidene compound, a tri(p-N-enamine-substituted-aminophenyl)benzene compound, a pyrene compound having one or two ethenyl groups having at least one aryl group, N,N''-di(biphenyl-4-yl)-N,N'-diphenyl-biphenyl-4,4'-diamine, N,N,N',N'-tetra(biphenyl-4-yl)biphenyl-4,4'-diamine, N,N,N',N'-tetra(biphenyl-4-yl)-3,3'-diethylbiphenyl-4,4'-diamine, 2,2'-(methylenedi-4,1-phenylene)bis[4,5-bis(4-methoxyphenyl)-2H-1,2,3-triazole], 2,2'-(biphenyl-4,4'-diyl)bis(4,5-diphenyl-2H-1,2,3-triazole), 2,2'-(3,3'-dimethylbiphenyl-4,4'-diyl)bis(4,5-diphenyl-2H-1,2,3-triazole), bis[4-(4,5-diphenyl-2H-1,2,3-triazol-2-yl)phenyl](methyl)amine, or the like.

The light-emitting layer 1013 is a layer containing a light-emitting substance, and may be formed of a wide variety of materials. For example, a fluorescent compound that exhibits fluorescence or a phosphorescent compound that exhibits phosphorescence can be used as the light-emitting substance. Organic compound materials that can be used for the light-emitting layer will be shown below, though the materials used for the light-emitting element are not limited to the following examples.

Blue to blue-green light emission can be obtained, for example, by using perylene, 2,5,8,11-tetra-t-butylperylene (abbreviation: TBP), 9,10-diphenylanthracene, or the like as a guest material, and dispersing the guest material in a suitable host material. Blue to blue-green light emission can also be obtained from a styrylarylene derivative such as 4,4'-bis(2,2-diphenylvinyl)biphenyl (abbreviation: DPVBi), or an anthracene derivative such as 9,10-di-2-naphthylanthracene (abbreviation: DNA) or 9,10-bis(2-naphthyl)-2-t-butylanthracene (abbreviation: t-BuDNA). Alternatively, a polymer such as poly(9,9-dioctylfluorene) may be used. As a guest material for blue light emission, a styrylamine derivative is preferably used, and examples thereof include N,N'-bis[4-(9H-carbazol-9-yl)phenyl]-N,N'-diphenylstilbene-4,4'-diamine (abbreviation: YGA2S), and N,N'-diphenyl-N,N'-bis(9-phenyl-9H-carbazol-3-yl)stilbene-4,4'-diamine (abbreviation: PCA2S). Among them, YGA2S is preferably used because it has a peak at around 450 nm. As a host material, an anthracene derivative such as 9,10-bis(2-naphthyl)-2-t-butylanthracene (abbreviation: t-BuDNA) or 9-[4-(10-phenyl-9-anthryl)phenyl]-9H-carbazole (abbreviation: CzPA) is preferably used. Among them, CzPA is preferably used because it is electrochemically stable.

Blue-green to green light emission can be obtained, for example, by using a coumarin dye such as coumarin 30 or coumarin 6; bis[2-(2,4-difluorophenyl)pyridinato]picolinatoiridium (abbreviation: FIrpic); bis(2-phenylpyridinato)acetylacetonatoiridium (abbreviation: Ir(ppy)$_2$(acac)); or the like as a guest material and dispersing the guest material in a suitable host material. Blue-green to green light emission can also be obtained by dispersing the aforementioned perylene or TBP in a suitable host material at a high concentration of 5 wt % or more. Alternatively, blue-green to green light emission can be obtained from a metal complex such as BAlq, Zn(BTZ)$_2$, or bis(2-methyl-8-quinolinolato)chlorogallium (Ga(mq)$_2$Cl). It is also possible to use a polymer such as poly(p-phenylenevinylene). As a guest material for a blue-green to green light-emitting layer, an anthracene derivative is preferably used because high emission efficiency can be obtained. For example, blue-green light emission with high efficiency can be obtained by using 9,10-bis{4-[N-(4-diphenylamino)phenyl-N-phenyl]aminophenyl}-2-tert-butylanthracene (abbreviation: DPABPA). Further, an anthracene derivative in which an amino group has been substituted into the 2-position is preferably used because green light emission with high efficiency can be obtained. In particular, N-(9,10-diphenyl-2-anthryl)-N,9-diphenyl-9H-carbazol-3-amine (abbreviation: 2PCAPA) that has a long life is preferably used. As a host material for these materials, an anthracene derivative is preferably used, and the aforementioned CzPA is preferably used because it is electrochemically stable. Further, in the case where a light-emitting element having two peaks in the blue to green wavelength range is manufactured by combining green light emission and blue light emission, an anthracene derivative having electron-transporting properties, such as CzPA, is preferably used as a host material for a blue-light-emitting layer and an aromatic amine compound having hole-transporting properties, such as NPB, is preferably used as a host material for a green-light-emitting layer, so that light emission can be obtained at the interface between the blue-light-emitting layer and the green-light-emitting layer. That is, in such a case, an aromatic amine compound like NPB is preferably used as a host material of a green-light-emitting material such as 2PCAPA.

Yellow to orange light emission can be obtained, for example, by using rubrene; 4-(dicyanomethylene)-2-[p-(dimethylamino)styryl]-6-methyl-4H-pyran (abbreviation: DCM1); 4-(dicyanomethylene)-2-methyl-6-(9-julolidyl)ethenyl-4H-pyran (abbreviation: DCM2); bis[2-(2-thienyl)pyridinato]acetylacetonatoiridium (abbreviation: Ir(thp)$_2$(acac)); bis(2-phenylquinolinato)acetylacetonato iridium (abbreviation: Ir(pq)$_2$(acac)); or the like as a guest material and dispersing the guest material in a suitable host material. In particular, a tetracene derivative such as rubrene is preferably used as a guest material because it is highly efficient and chemically stable. As a host material in that case, an aromatic amine compound such as NPB is preferably used. Alternatively, a metal complex such as bis(8-quinolinolato)zinc (abbreviation: Znq$_2$) or bis[2-cinnamoyl-8-quinolinolato]zinc (abbreviation: Znsq$_2$) can be used as a host material. Further alternatively, a polymer such as poly(2,5-dialkoxy-1,4-phenylenevinylene) may be used.

Orange to red light emission can be obtained, for example, by using 4-(dicyanomethylene)-2,6-bis[p-(dimethylamino)styryl]-4H-pyran (abbreviation: BisDCM); 4-(dicyanomethylene)-2,6-bis[2-(julolidin-9-yl)ethynyl]-4H-pyran (abbreviation: DCM1); 4-(dicyanomethylene)-2-methyl-6-(9-julolidyl)ethenyl-4H-pyran (abbreviation: DCM2); bis[2-(2-thienyl)pyridinato]acetylacetonato iridium (abbreviation: Ir(thp)$_2$(acac)), or the like as a guest material, and dispersing the guest material in a suitable host material. Orange to red light emission can also be obtained from a metal complex such as bis(8-quinolinolato)zinc (abbreviation: Znq$_2$) or bis[2-cinnamoyl-8-quinolinolato]zinc (abbreviation: Znsq$_2$). Alternatively, a polymer such as poly(3-alkylthiophene) may be used. As a guest material exhibiting red light emission, it is preferable to use a 4H-pyran derivative that has high emission efficiency, such as 4-(dicyanomethylene)-2,6-bis[p-(dimethylamino)styryl]-4H-pyran (abbreviation: BisDCM), 4-(dicyanomethylene)-2,6-bis[2-(julolidin-9-yl)ethynyl]-4H-pyran (abbreviation: DCM1), 4-(dicyanomethylene)-2-methyl-6-(9-julolidyl)ethenyl-4H-pyran (abbreviation: DCM2), {2-isopropyl-6-[2-(2,3,6,7-tetrahydro-1,1,7,7-tetramethyl-1H,5H-benzo[ij]quinolizin-9-yl)ethenyl]-4H-pyran-4-ylidene}propanedinitrile (abbreviation: DCJTI), or {2,6-bis[2-(2,3,6,7-tetrahydro-8-methoxy-1,1,7,7-tetramethyl-1H,5H-benzo[ij]quinolizin-9-yl)ethenyl]-4H-pyran-4- ylidene}propanedinitrile (abbreviation: BisDCJTM). Among them, DCJTI and BisDCJTM are preferably used because they have an emission peak at around 620 nm.

Note that the light-emitting layer 1013 may have a structure in which any of the above light-emitting substances (guest materials) is dispersed in another substance (a host material). A substance having a high light-emitting property can be dispersed in various kinds of substances, and it is preferably dispersed in a substance that has a lowest unoccupied molecular orbital (LUMO) level higher than that of the substance having a high light-emitting property and has a highest occupied molecular orbital (HOMO) level lower than that of the substance having a high light-emitting property.

Specific examples of the substance in which the substance having light-emitting properties is dispersed are as follows: a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: IPBI), bathophenanthroline (abbreviation: BPhen), or bathocuproine (abbreviation: BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), 9,10-diphenylanthracene (abbreviation: DPAnth), or 6,12-dimethoxy-5,11-diphenylchrysene; and an aromatic amine compound such as N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB.

Further, a light-emitting substance may be dispersed in plural kinds of substances. For example, a substance such as rubrene, which suppresses crystallization, may be further added in order to prevent crystallization. Moreover, NPB, Alq, or the like may be further added in order to increase the efficiency in energy transfer to the light-emitting substance.

By dispersing a light-emitting substance in another substance, crystallization of the light-emitting layer 1013 can be suppressed. Furthermore, it is also possible to suppress concentration quenching due to a high concentration of a light-emitting substance.

The electron-transporting layer 1014 is a layer containing a substance having a high electron-transporting property. Examples of the substance having a high electron-transporting property include: a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq). Alternatively, a metal complex having an oxazole-based ligand or a thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can be used. Besides the metal complexes, it is also possible to use 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), bis[3-(1H-benzimidazol-2-yl)fluoren-2-olato]zinc(II), bis[3-(1H-benzimidazol-2-yl)fluoren-2-olato]beryllium(II), bis[2-(1H-benzimidazol-2-yl)dibenzo[b,d]furan-3-olato](phenolato)aluminum(III), bis[2-(benzoxazol-2-yl)-7,8-methylenedioxydibenzo[b,d]furan-3-olato](2-naphtholato)aluminum(III), or the like. The substances described here are mainly substances having an electron mobility of $10^{-6}$ cm$^2$/Vs or higher, though the electron-transporting layer 1014 may be made of other substances as long as the electron-transporting properties thereof are higher than the hole-transporting properties thereof. Note that the electron-transporting layer 1014 is not limited to a single layer, but may be stacked layers of two or more layers containing the aforementioned substances.

The electron-injecting layer 1015 is a layer containing a substance having a high electron-injecting property. Examples of the substance having a high electron-injecting property include an alkali metal, an alkaline earth metal, and a compound of these metals, such as lithium fluoride (LiF), cesium fluoride (CsF), or calcium fluoride (CaF$_2$). It is also possible to use an electron-injecting composite material including an organic compound (preferably, an organic compound having electron-transporting properties) and an inorganic compound (preferably, an alkali metal, an alkaline earth metal, a rare earth metal, or a compound of these metals). As the electron-injecting composite material, for example, a layer made of Alq mixed with magnesium (Mg) may be used. Such a structure increases the efficiency in electron injection from the cathode 1002.

In the case where the electron-injecting layer 1015 is made of the aforementioned electron-injecting composite material, a variety of conductive materials such as Al, Ag, ITO, or ITO containing silicon or silicon oxide can be used for the cathode 1002 regardless of the work function.

The EL layer 1003 can be formed by stacking the above layers in appropriate combination. Note that the light-emitting layer 1013 may have a stacked-layer structure of two or more layers. When the light-emitting layer 1013 has a stacked-layer structure of two or more layers and the kind of light-emitting substance for each light-emitting layer is changed, various emission colors can be obtained. In addition, by using plural kinds of light-emitting substances having different emission colors, light emission with a broad spectrum or white light emission can also be obtained. A light-emitting layer having a stacked-layer structure is preferably used particularly for lighting devices that require high luminance.

The EL layer 1003 can be formed by various methods (e.g., a dry process or a wet process), which can be selected as appropriate depending on a material used. For example, the EL layer 1003 can be formed by vacuum evaporation, sputtering, ink-jet, or spin coating. Each layer of the EL layer 1003 may be formed by a different method.

Further, the light-emitting element shown in this embodiment can be formed by various methods such as a dry process (e.g., vacuum evaporation or sputtering), or a wet process (e.g., ink-jet or spin coating).

Figure 11B:
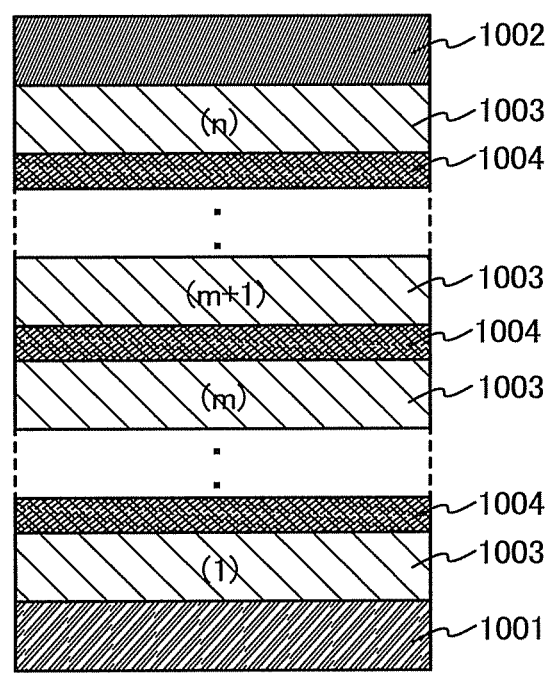

Note that the light-emitting element shown in this embodiment may have a structure illustrated in FIG. 11B, a so-called stacked element structure, in which a plurality of the EL layers 1003 are stacked between a pair of electrodes. Note that in the case where the EL layer 1003 has a stacked-layer structure including, for example, n layers (n is a natural number of two or more), an intermediate layer 1004 is provided between an m-th (m is a natural number, $1 \leq m \leq n-1$) EL layer and an (m+1)-th EL layer.

The intermediate layer 1004 has a function of, when a voltage is applied between the anode 1001 and the cathode 1002, injecting electrons to one of the EL layers 1003 in contact with the intermediate layer 1004, which is on the anode 1001 side, and injecting holes to the other EL layer 1003 on the cathode 1002 side.

The intermediate layer 1004 can be made not only by using the aforementioned composite materials (a hole-injecting composite material or an electron-injecting composite material) of an organic compound and an inorganic compound, but also by appropriately combining materials such as metal oxides. More preferably, the intermediate layer 1004 is made of a combination of a hole-injecting composite material and other materials. Such materials used for the intermediate layer 1004 have excellent carrier-injecting properties and carrier-transporting properties, whereby a light-emitting element driven with low current and low voltage can be realized.

In the case where an EL layer has two stacked layers in a stacked element structure, white light emission can be obtained by allowing a first EL layer and a second EL layer to emit light of complementary colors. Note that white light emission can also be obtained in a structure where each of the first EL layer and the second EL layer includes a plurality of light-emitting layers emitting light of complementary colors. Examples of complementary colors include blue and yellow, and blue-green and red. A substance emitting light of blue, yellow, blue-green, or red may be selected as appropriate from, for example, the light-emitting substances given above.

The following is an example of the structure where each of the first EL layer and the second EL layer includes a plurality of light-emitting layers emitting light of complementary colors.

For example, the first EL layer includes a first light-emitting layer that emits light having an emission spectrum with a peak in the wavelength range of blue to blue-green, and a second light-emitting layer that emits light having an emission spectrum with a peak in the wavelength range of yellow to orange. The second EL layer includes a third light-emitting layer that emits light having an emission spectrum with a peak in the wavelength range of blue-green to green, and a fourth light-emitting layer that emits light having an emission spectrum with a peak in the wavelength range of orange to red.

In that case, light emission from the first EL layer is a combination of light emission from both the first light-emitting layer and the second light-emitting layer and thus exhibits an emission spectrum having peaks both in the wavelength range of blue to blue-green and in the wavelength range of yellow to orange. That is, the first EL layer emits light of two-wavelength white color or almost white color.

Further, light emission from the second EL layer is a combination of light emission from both the third light-emitting layer and the fourth light-emitting layer and thus exhibits an emission spectrum having peaks both in the wavelength range of blue-green to green and in the wavelength range of orange to red. That is, the second EL layer emits light of two-wavelength white color or almost white color, which is different from that of the first EL layer.

Accordingly, a combination of the light-emission from the first EL layer and the light emission from the second EL layer can provide white light emission that covers the wavelength range of blue to blue-green, the wavelength range of blue-green to green, the wavelength range of yellow to orange, and the wavelength range of orange to red.

Note that in the aforementioned stacked element structure, the intermediate layer between the stacked EL layers allows the element to perform light emission in a high-luminance region while keeping the current density low, whereby the element can have long life. In addition, the voltage drop due to the resistance of the electrode material can be reduced, resulting in uniform light emission in a large area.

Note that this embodiment can be combined with any of the other embodiments as appropriate.

Embodiment 7

In this embodiment, application examples of the lighting device will be described.

Figure 12:
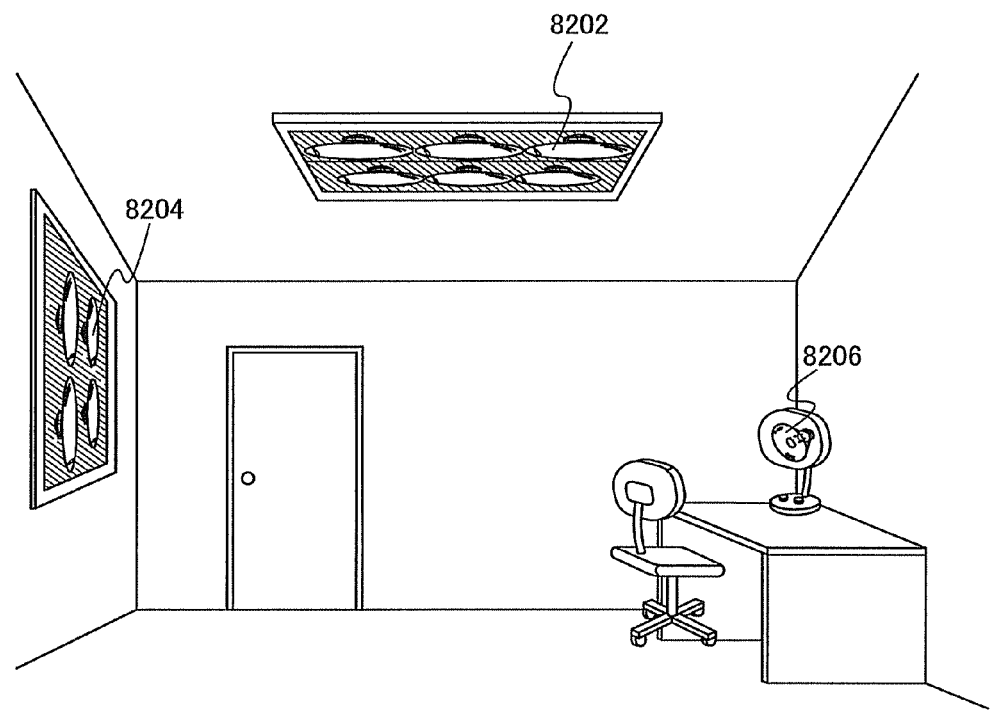
FIG. 12 is a diagram illustrating examples of application of a lighting device.

FIG. 12 illustrates an example in which the lighting device of one embodiment of the present invention is used as an indoor lighting device. The lighting device of one embodiment of the present invention can be used not only as a ceiling-mounted lighting device 8202, but also as a wall-mounted lighting device 8204. The lighting device can also be used as a desk lighting device 8206. Since the lighting device of one embodiment of the present invention has a planar light source, it has advantages such as a reduction in the number of components like a light-reflecting plate as compared with the case of using a point light source, or less heat generation as compared with a filament bulb, and is preferably used as an indoor lighting device.

Figure 13A:
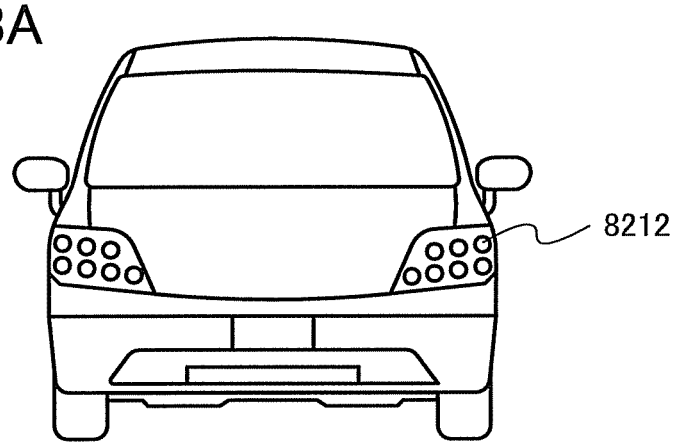
FIGS. 13A to 13C are diagrams each illustrating an example of application of a lighting device.
Figure 13B:
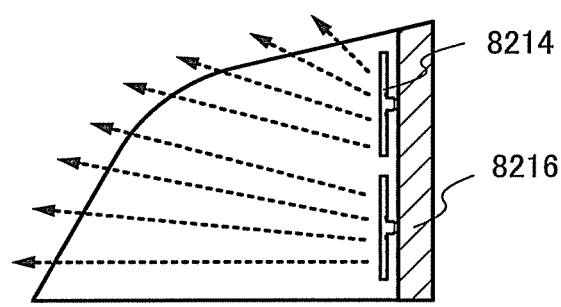
Figure 13C:
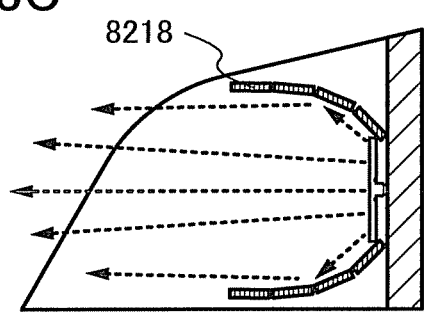

The lighting device of one embodiment of the present invention can also be used as headlights of an automobile, a bicycle, or the like. FIGS. 13A to 13C illustrate an example of using the lighting device of one embodiment of the present invention as headlights of an automobile. FIG. 13A is an external view of an automobile using the lighting device of one embodiment of the present invention as headlights 8212. FIGS. 13B and 13C are cross-sectional views of the headlights 8212 of FIG. 13A. In FIGS. 13B and 13C, lighting devices 8214 connected to a power supplying connector 8216 are used as light sources. Since the plurality of lighting devices 8214 are used in FIG. 13B, high-luminance light can be emitted to the outside. On the other hand, in FIG. 13C, light from the lighting device is condensed by reflecting plates 8218, whereby high-luminance light having directivity can be emitted to the outside.

Figure 14A:
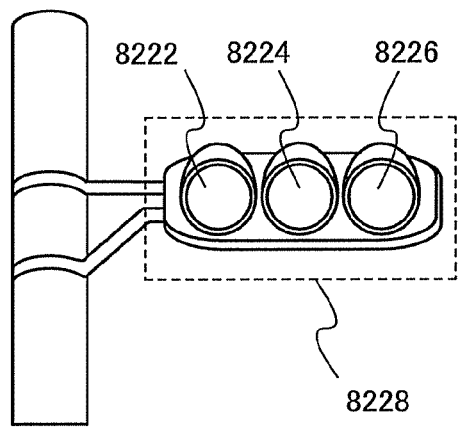
FIGS. 14A to 14E are diagrams each illustrating an example of application of a lighting device.

Next, FIG. 14A illustrates an example in which the lighting device of one embodiment of the present invention is applied to a lighting device such as traffic lights or guide lights.

For example, FIG. 14A is an external view of a traffic light. A traffic light 8228 includes a green light 8222, an amber light 8224, and a red light 8226. The traffic light 8228 includes the lighting device of one embodiment of the present invention as a lighting device corresponding to each of the green, amber, and red lights.

Figure 14B:
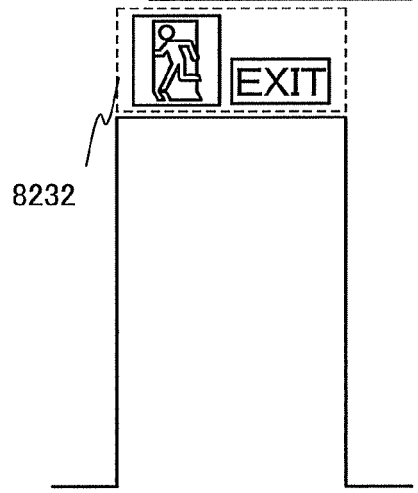

FIG. 14B illustrates an example in which the lighting device of one embodiment of the present invention is applied to an emergency exit light.

For example, FIG. 14B is an external view of an emergency exit light. An emergency exit light 8232 can be formed by combination of a lighting device and a fluorescent plate provided with a fluorescent portion. The emergency exit light 8232 can also be formed by combination of a lighting device emitting a specific light and a light-shielding plate provided with a transmitting portion having a shape illustrated in FIG. 14B. The lighting device of one embodiment of the present invention can emit light with a constant luminance, and thus is preferably used as an emergency exit light that needs to be on at all times.

Figure 14C:
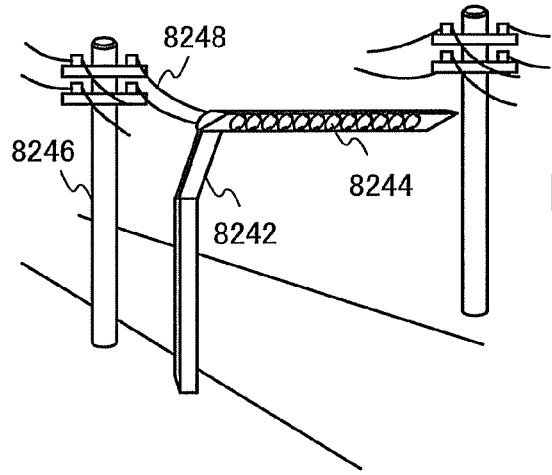

FIG. 14C illustrates an example in which the lighting device of one embodiment of the present invention is applied to an outdoor light.

An example of the outdoor light is a streetlight. A streetlight can be formed by, for example, a housing 8242 and a lighting portion 8244 as illustrated in FIG. 14C. A plurality of lighting devices of one embodiment of the present invention are arranged in the lighting portion 8244. As illustrated in FIG. 14C, for example, the streetlight stands by the side of a road so that the lighting portion 8244 can illuminate the surroundings, whereby the visibility of the road and its surroundings can be improved.

In the case where a power source voltage is supplied to the streetlight, for example, it can be supplied through a power line 8248 on a utility pole 8246 as illustrated in FIG. 14C. Note that the present invention is not limited to this case; for example, a photoelectric converter may be provided in the housing 8242 so that a voltage obtained from the photoelectric converter can be used as a power source voltage.

Figure 14D:
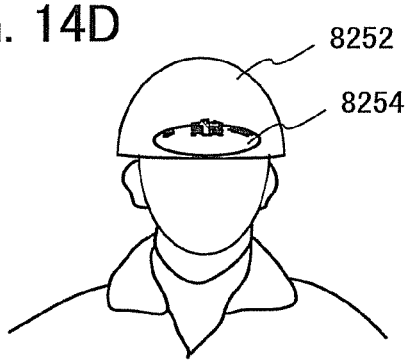
Figure 14E:
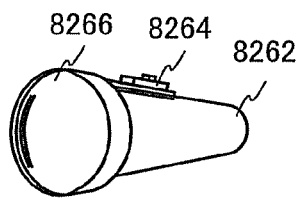

FIGS. 14D and 14E illustrate examples in which the lighting device of one embodiment of the present invention is applied to a portable light. FIG. 14D illustrates a structure of a mounted light and FIG. 14E illustrates a structure of a handheld light.

The mounted light illustrated in FIG. 14D includes a mounting portion 8252 and a lighting portion 8254 fixed to the mounting portion 8252. The lighting device of one embodiment of the present invention can be used for the lighting portion 8254. In the mounted light illustrated in FIG. 14D, the lighting portion 8254 can emit light while the mounting portion 8252 is attached to the head. When a planar light source is used for the lighting portion 8254, the visibility of the surroundings can be improved. In addition, the lighting portion 8254 is lightweight, which makes it possible to reduce the load on the head on which the light is mounted.

Note that the structure of the mounted light is not limited to that illustrated in FIG. 14D, and for example, the following structure can be employed: the mounting portion 8252 is formed as a ring belt of flat braid or elastic braid, the lighting portion 8254 is fixed to the belt, and the belt is directly tied around the head.

The handheld light illustrated in FIG. 14E includes a housing 8262, a lighting portion 8266, and a switch 8264. The lighting device of one embodiment of the present invention can be used for the lighting portion 8266. The use of the lighting device of one embodiment of the present invention reduces the thickness of the lighting portion 8266 and thus reduces the size of the light, which makes it easy for the light to be carried around.

The switch 8264 has a function of controlling emission or non-emission of the lighting portion 8266. The switch 8264 can also have a function of controlling, for example, the luminance of the lighting portion 8266 during light emission.

In the handheld light illustrated in FIG. 14E, the lighting portion 8266 is turned on with the switch 8264 so as to illuminate the surroundings, whereby the visibility of the surroundings can be improved. Furthermore, since the lighting device of one embodiment of the present invention has a planar light source, the number of components like a light-reflecting plate can be reduced as compared with the case of using a point light source.

What is described in this embodiment with reference to each drawing can be freely combined with or replaced with what is described in other embodiments as appropriate.

This application is based on Japanese Patent Application serial No. 2009-066561 filed with the Japan Patent Office on Mar. 18, 2009, the entire contents of which are hereby incorporated by reference.

What is claimed is:

1. A lighting device comprising:
a substrate;
a light-emitting element over the substrate, the light-emitting element comprising:
 a first electrode layer over the substrate, the first electrode layer comprising a first connecting portion at a first peripheral portion of the substrate;
 a light-emitting layer over the first electrode layer; and
 a second electrode layer over the light-emitting layer, the second electrode layer comprising a second connecting portion at a second peripheral portion of the substrate;
a protective layer covering the light-emitting element except for the first connecting portion and the second connecting portion;
a first wiring over the protective layer; and
a second wiring over the protective layer,
wherein the first wiring is electrically connected to the first electrode layer at the first connecting portion,
wherein the second wiring is electrically connected to the second electrode layer at the second connecting portion,
wherein the first wiring and the second wiring extend to a central portion of the protective layer and are separated from each other with a gap in the central portion,
wherein at least one of the first electrode layer and the second electrode layer has a light-transmitting property, and
wherein the first wiring and the second wiring are formed on a same surface of the protective layer.

2. The lighting device according to claim 1, further comprising an insulating barrier layer between the substrate and the first electrode layer.

3. The lighting device according to claim 1, wherein the substrate has a round shape.

4. The lighting device according to claim 3, wherein the substrate has a diameter of 10 cm to 14 cm.

5. The lighting device according to claim 1, wherein the light-emitting layer includes a first layer comprising a first light-emitting substance and a second layer comprising a second light-emitting substance.

6. The lighting device according to claim 5, wherein an intermediate layer is provided between the first layer comprising the first light-emitting substance and the second layer comprising the second light-emitting substance.

7. The lighting device according to claim 1, wherein the light-emitting layer covers the first electrode layer except for the first connecting portion.

8. A lighting device comprising:
a substrate;
a light-emitting element over the substrate, the light-emitting element comprising:

a first electrode layer over the substrate, the first electrode layer comprising a connecting portion at a peripheral portion of the substrate;

a light-emitting layer over the first electrode layer; and a second electrode layer over the light-emitting layer, the second electrode layer comprising a terminal portion;

a protective layer covering the light-emitting element except for the connecting portion and the terminal portion; and a wiring over the protective layer, wherein the wiring is electrically connected to the first electrode layer at the connecting portion, wherein the light-emitting layer is positioned above the substrate, wherein an entirety of an upper surface of the terminal portion is exposed and positioned above the light-emitting layer, and wherein at least one of the first electrode layer and the second electrode layer has a light-transmitting property.

9. The lighting device according to claim 8, further comprising an insulating barrier layer between the substrate and the first electrode layer.

10. The lighting device according to claim 8, wherein the substrate has a round shape.

11. The lighting device according to claim 10, wherein the substrate has a diameter of 10 cm to 14 cm.

12. The lighting device according to claim 8, wherein the light-emitting layer includes a first layer comprising a first light-emitting substance and a second layer comprising a second light-emitting substance.

13. The lighting device according to claim 12, wherein an intermediate layer is provided between the first layer comprising the first light-emitting substance and the second layer comprising the second light-emitting substance.

14. The lighting device according to claim 8, wherein the light-emitting layer covers the first electrode layer except for the connecting portion.

15. A lighting device comprising:

a substrate;

an insulating layer over the substrate;

a light-emitting element over the insulating layer, the light-emitting element comprising:

a first electrode layer over the insulating layer;

a light-emitting layer over the first electrode layer; and a second electrode layer over the light-emitting layer; and a protective layer covering the light-emitting element, wherein the first electrode layer and the second electrode layer extend to a central portion of the insulating layer and are separated from each other with a gap in the central portion, wherein a part of the first electrode layer is exposed at the central portion, wherein a part of the second electrode layer is exposed at the central portion, wherein an edge of the first electrode layer is covered by the protective layer at a peripheral portion of the substrate, wherein the part of the first electrode layer and the part of the second electrode layer are provided on the insulating layer, and wherein at least one of the first electrode layer and the second electrode layer has a light-transmitting property.

16. The lighting device according to claim 15, wherein the substrate has a round shape.

17. The lighting device according to claim 16, wherein the substrate has a diameter of 10 cm to 14 cm.

18. The lighting device according to claim 15, wherein the light-emitting layer includes a first layer comprising a first light-emitting substance and a second layer comprising a second light-emitting substance.

19. The lighting device according to claim 18, wherein an intermediate layer is provided between the first layer comprising the first light-emitting substance and the second layer comprising the second light-emitting substance.

* * * * *

UNITED STATES PATENT AND TRADEMARK OFFICE
CERTIFICATE OF CORRECTION

PATENT NO. : 8,847,480 B2  
APPLICATION NO. : 12/722791  
DATED : September 30, 2014  
INVENTOR(S) : Shunpei Yamazaki et al.

Page 1 of 1

It is certified that error appears in the above-identified patent and that said Letters Patent is hereby corrected as shown below:

In the Specification:

Column 4, Line 44; Change "fainted" to --formed--.

Column 6, Line 1; Change "ZnS.SiO$_2$" to --ZnS · SiO$_2$--.

Column 6, Line 18; Change "ZnS.SiO$_2$" to --ZnS · SiO$_2$--.

Column 6, Line 20; Change "polyimide," to --polyamide,--.

Column 6, Line 26; Change "framed" to --formed--.

Column 6, Line 33; Change "fanned" to --formed--.

Column 14, Line 35; Change "AlLi);" to --AlLi)--.

Column 15, Line 4; Change "trip-N" to --tri(p-N--.

Column 15, Line 60; Change "diamine abbreviation:" to --diamine(abbreviation:--.

Column 17, Line 10; Change "group, N,N"-di(" to --group, N,N'-di(--.

Column 18, Line 31; Change "acetylacetonato iridium" to --acetylacetonatoiridium--.

Column 18, Line 49; Change "acetylacetonato iridium" to --acetylacetonatoiridium--.

Column 19, Line 19; Change "BeBg$_2$)," to --BeBq$_2$),--.

Column 19, Line 30; Change "IPBI)," to --TPBI),--.

Signed and Sealed this  
Twenty-fourth Day of March, 2015

Michelle K. Lee  
*Director of the United States Patent and Trademark Office*